(12) United States Patent
Kamikawa

(10) Patent No.: US 6,575,178 B1
(45) Date of Patent: Jun. 10, 2003

(54) CLEANING AND DRYING METHOD AND APPARATUS

(75) Inventor: Yuji Kamikawa, Koshi-machi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/690,024

(22) Filed: Oct. 16, 2000

Related U.S. Application Data

(62) Division of application No. 09/116,531, filed on Jul. 16, 1998, now Pat. No. 6,158,449.

(30) Foreign Application Priority Data

Jul. 17, 1997 (JP) .............................................. 9-207385
Dec. 19, 1997 (JP) .............................................. 9-364315

(51) Int. Cl.[7] .................................................. B08B 3/10
(52) U.S. Cl. ....................... 134/88; 134/102.3; 134/105; 134/158; 134/183; 134/200; 134/902
(58) Field of Search ........................ 134/82, 88, 102.3, 134/105, 133, 135, 140, 147, 158, 164, 183, 902, 200; 15/77, 102, 21.1, 88.2, 97.1

(56) References Cited

U.S. PATENT DOCUMENTS

| | | | | |
|---|---|---|---|---|
| 4,027,686 A | * | 6/1977 | Shortes et al. |
| 4,132,235 A | * | 1/1979 | Koplin et al. |
| 4,558,524 A | * | 12/1985 | Peck et al. |
| 4,694,527 A | * | 9/1987 | Yoshizawa |
| 4,722,752 A | * | 2/1988 | Steck |
| 4,899,768 A | * | 2/1990 | Yatabe |
| 4,902,350 A | * | 2/1990 | Steck |
| 4,983,223 A | * | 1/1991 | Gessner |
| 5,143,103 A | * | 9/1992 | Basso et al. |
| 5,167,716 A | * | 12/1992 | Boitnott et al. |
| 5,191,908 A | * | 3/1993 | Hiroe et al. |
| 5,213,118 A | * | 5/1993 | Kamikawa |
| 5,275,184 A | * | 1/1994 | Nishizawa et al. |
| 5,303,671 A | * | 4/1994 | Kondo et al. |
| 5,317,778 A | * | 6/1994 | Kudo et al. |
| 5,327,921 A | * | 7/1994 | Mokuo et al. |
| 5,331,987 A | * | 7/1994 | Hayashi et al. |
| 5,370,142 A | * | 12/1994 | Nishi et al. |
| 5,569,330 A | * | 10/1996 | Schild et al. |
| 5,571,367 A | * | 11/1996 | Nakajima et al. |
| 5,657,553 A | * | 8/1997 | Tarui et al. |
| 5,730,162 A | * | 3/1998 | Shindo et al. |
| 5,807,439 A | * | 9/1998 | Akatsu et al. |
| 5,845,660 A | * | 12/1998 | Shindo et al. |
| 5,862,823 A | * | 1/1999 | Kamikawa et al. |
| 5,896,875 A | * | 4/1999 | Yoneda |
| 5,902,402 A | * | 5/1999 | Durst et al. |
| 5,954,068 A | * | 9/1999 | Weber et al. |
| 5,960,562 A | * | 10/1999 | Nishida et al. |
| 6,139,645 A | * | 10/2000 | Leenaars et al. |
| 6,269,822 B1 | * | 8/2001 | Funkhanel et al. |

FOREIGN PATENT DOCUMENTS

| | | |
|---|---|---|
| JP | 06-120197 | 4/1994 |
| JP | 06-283496 | 10/1994 |
| JP | 06-283497 | 10/1994 |
| JP | 07-335601 | 12/1995 |

* cited by examiner

*Primary Examiner*—Frankie L. Stinson
(74) *Attorney, Agent, or Firm*—Morrison & Foerster LLP

(57) ABSTRACT

An enclosure 23A that defines a drying chamber 23 is configured of a pair of enclosing elements 23c and 23d and a base element 23b. When wafers enter or leave the drying chamber 23, the enclosing elements 23c and 23d are lifted upward by vertical air cylinders 42 to separate them from the base element 23b. The enclosing elements 23c and 23d are then moved in directions that mutually separate them. To dry wafers within the drying chamber 23, the enclosing elements and the base element 23b are mutually engaged to form a hermetic seal, in the opposite sequence.

The present invention reduces the dimensions of the drying chamber without impeding the work of moving wafers into and out of the drying chamber. This makes it possible to reduce the internal volume of the drying chamber, achieving a reduction is the consumption of drying gas, an improvement in the drying efficiency, and a reduction in overall size of the apparatus.

12 Claims, 19 Drawing Sheets

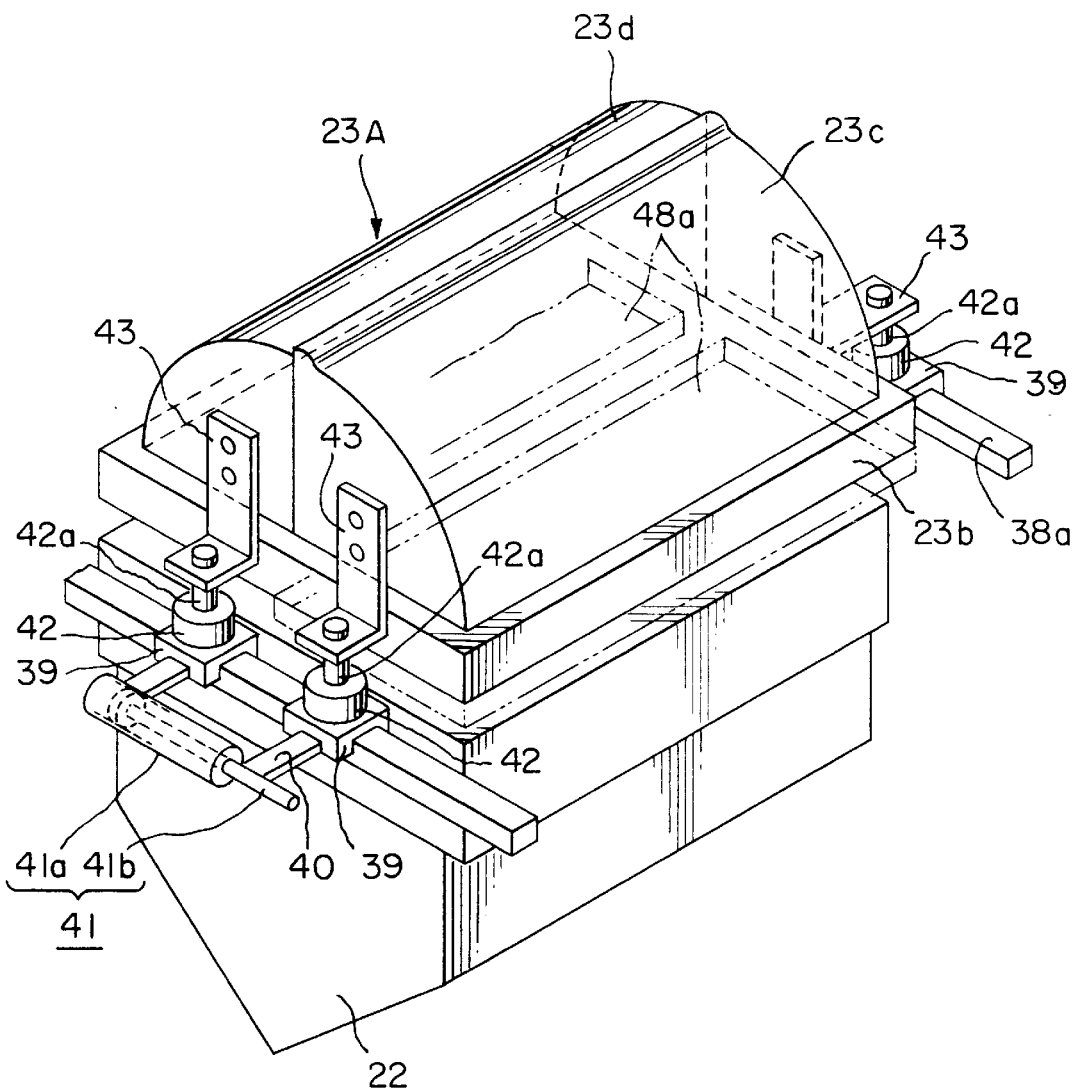
F I G. 5

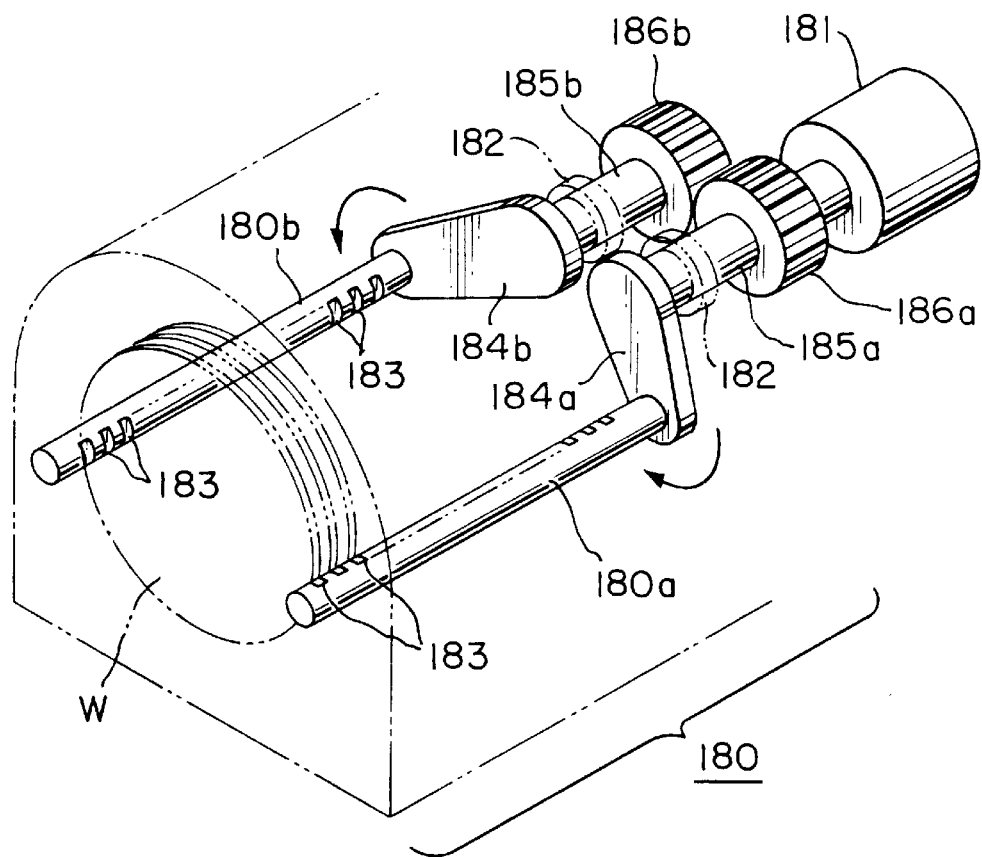
F I G. 17

CLEANING AND DRYING METHOD AND APPARATUS

This application is a divisional of Ser. No. 09/116,531, filed Jul. 16, 1998, now U.S. Pat. No. 6,158,449.

BACKGROUND OF THE INVENTION

1. Field of the Invention

The present invention relates to a method of and apparatus for cleaning objects to be treated, such as semiconductor wafers or LCD (liquid crystal display) substrates etc., by immersing them in a cleaning liquid such as a chemical or a rinse, and sequentially drying the objects cleaned.

2. Description of the Related Art

During the process of fabricating a semiconductor device, a cleaning method is widely used to sequentially immerse objects to be treated or processed, such as semiconductor wafers or glass LCD substrates, into a processing tank filled with a processing liquid such as a chemical or rinse (cleaning liquid), to wash them.

A cleaning and drying apparatus of this type is provided with a drying device wherein a drying gas obtained from vapor of a volatile organic solvent such as isopropyl alcohol (IPA) is brought into contact with the surfaces of the wafers after the cleaning, the vapor of the drying gas condenses thereon or adheres thereto, and thus moisture on the wafers is removed, drying the wafers.

A conventional cleaning and drying apparatus that is known in the art as a typical example of this type of cleaning and drying apparatus is shown in FIG. 27. It comprises a cleaning tank A (cleaning chamber) which is filled with a chemical such as hydrofluoric acid and a rinse (cleaning liquid) such as distilled water, wherein objects to be treated, such as semiconductor wafers, are immersed in the chemical and cleaning liquid therein; a drying portion B positioned above the cleaning tank A; and a movement means such as a wafer boat C that holds a plurality of wafers W, such as 59 wafers W, and moves those wafers W into the cleaning tank a and the drying portion B.

Within the cleaning and drying apparatus of the above configuration, supply nozzles D that are connected selectively to a chemical source and a cleaning liquid source (not shown in the figure) are disposed within the cleaning tank A; drying gas supply nozzles E that are connected to a source (not shown in the figure) of a gas mixture of a drying gas such as IPA and nitrogen ($N_2$) are disposed within the drying portion B; an aperture G that is freely enterable by a wafer conveyor chuck E is provided in an upper portion of the drying portion B; and a lid H is provided for opening and closing the aperture G.

In the thus-configured cleaning and drying apparatus, a plurality of wafers W, such as 50 wafers W, that have been transferred into the drying portion B by the wafer conveyor chuck E are received by the wafer boat C which is on standby within the drying portion B, the wafer boat C that has received these wafers W is lowered into the cleaning tank A to move the wafers W thereinto, and chemical processing is performed by supplying a chemical thereto and cleaning is performed by supplying a cleaning liquid thereto until it overflows. After the chemical processing and cleaning have been completed, the wafer boat C rises to move the wafers W into the drying portion B, and a drying gas (IPA+$N_2$) is supplied from the drying gas supply nozzles E to bring the drying gas into contact with the wafers W, thus drying them. The dried wafers W are taken by the wafer conveyor chuck E that enters into the drying portion B and are conveyed outside, whereby one cycle of cleaning and drying is performed.

However, when the wafers W are transferred between the wafer boat C and the wafer conveyor chuck E that enters the drying portion B in the conventional cleaning and drying apparatus of this type, it is necessary to move the chuck portions sideways in order to enable the wafer conveyor chuck E to switch from a wafer holding state to a wafer non-holding state. It is therefore necessary to provide movement space within the drying portion B for the wafer conveyor chuck E, and the volume of the drying portion B must be increased accordingly. This increase in volume of the drying portion B not only leads to an increase in size of the apparatus, it raises further problems such as an increase in the amount of drying gas consumed therein and a lowering of the drying efficiency.

In addition, after the wafer boat C has risen to move the wafers W into the drying portion B of the above cleaning and drying apparatus, and during the drying process of supplying the drying gas to cause the drying gas to come into contact with the wafers W, the portions of the wafers W in contact with the wafer boat C that have been raised from within the cleaning liquid are in a state wherein drainage therefrom is bad and it is also difficult for the drying gas to come into contact therewith. Therefore, considerable time is required to dry the portions of the wafers W in contact with the wafer boat C, which causes a further increase in the consumption of drying gas, and this raises problems concerning decreased drying efficiency and increased cost. There are further problems concerning the danger of unevenness in the drying and reductions in yield.

SUMMARY OF THE INVENTION

A first objective of the present invention is to provide a cleaning and drying apparatus which can be designed to have a drying chamber with a small volume so that the entire apparatus is more compact, wherein a reduction in the consumption of drying gas and an increase in the drying efficiency can be expected.

A second objective of the present invention is to provide a cleaning and drying apparatus and method which can be expected to solve the problem of bad drainage at held portions, provide good contact between those portions and the drying gas, shorten the drying time and reduce the consumption of drying gas, improve the drying efficiency and the yield, and also reduce costs.

In order to achieve the first objective, a first aspect of the present invention relates to a cleaning and drying apparatus having a cleaning chamber for cleaning an object and a drying chamber positioned above the cleaning chamber for drying the object, the apparatus including: an enclosure defining the drying chamber, the enclosure including first and second enclosing elements capable of relative movement, such that the enclosing elements are capable of adopting an engaged state and a separated state concomitant with the relative movement, wherein when the enclosing elements are in the separated state the first and second enclosing elements are spaced apart horizontally and the object is allowed to be transferred into and out of the drying chamber between the enclosing elements.

In order to achieve the second objective, a second aspect of the present invention relates to a cleaning and drying apparatus having a cleaning chamber for cleaning an object and a drying chamber positioned above the cleaning chamber for drying the object, the apparatus including: carrying means for carrying the object movable between the cleaning chamber and the drying chamber, the carrying means being in contact with a first portion of the object when the carrying means carries the object; and holding means provided in the drying chamber for holding the object in a second portion thereof, the second portion being different from the first portion.

In order to achieve the second objective, a third aspect of the present invention relates to a method of cleaning and drying an object, including the steps of: (a) accommodating the object in a cleaning chamber in a state in which a first portion of the object is in contact with carrying means, and cleaning the object by a cleaning liquid supplied into the cleaning chamber; (b) raising the carrying to move the object into a drying chamber provided above the cleaning chamber; (c) holding a second portion of the object that differs from the first portion by holding means, and making the carrying means be away from the object; and (d) drying the object with a drying gas, in a state in which the second portion of the object is held by the holding means.

The advantages and features of the present invention will be discussed in detail below, with reference to the accompanying figures.

BRIEF DESCRIPTION OF THE DRAWINGS

FIG. 5 is a schematic perspective view of the cleaning and drying apparatus of FIG. 3;

FIG. 17 is a perspective view illustrating the configuration of the second holder device of FIG. 15;

DESCRIPTION OF PREFERRED EMBODIMENTS

Embodiments of the present invention are described below with reference to the accompanying figures. Note that this description relates to the application of the cleaning and drying apparatus of the present invention to a system for cleaning semiconductor wafers.

Figure 1:
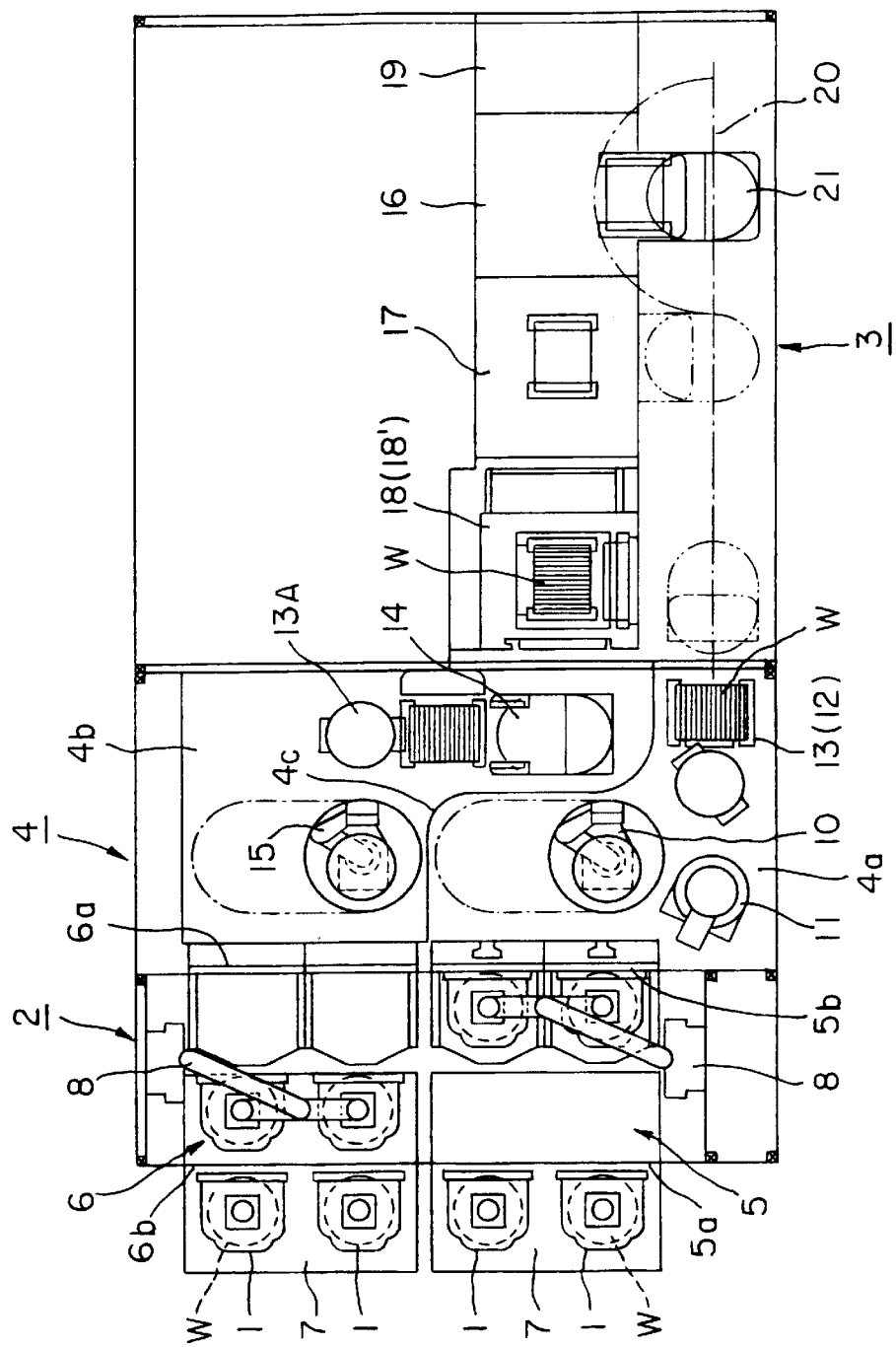
FIG. 1 is a schematic plan view of a cleaning and drying system to which the cleaning and drying apparatus of the present invention is applied.
Figure 2:
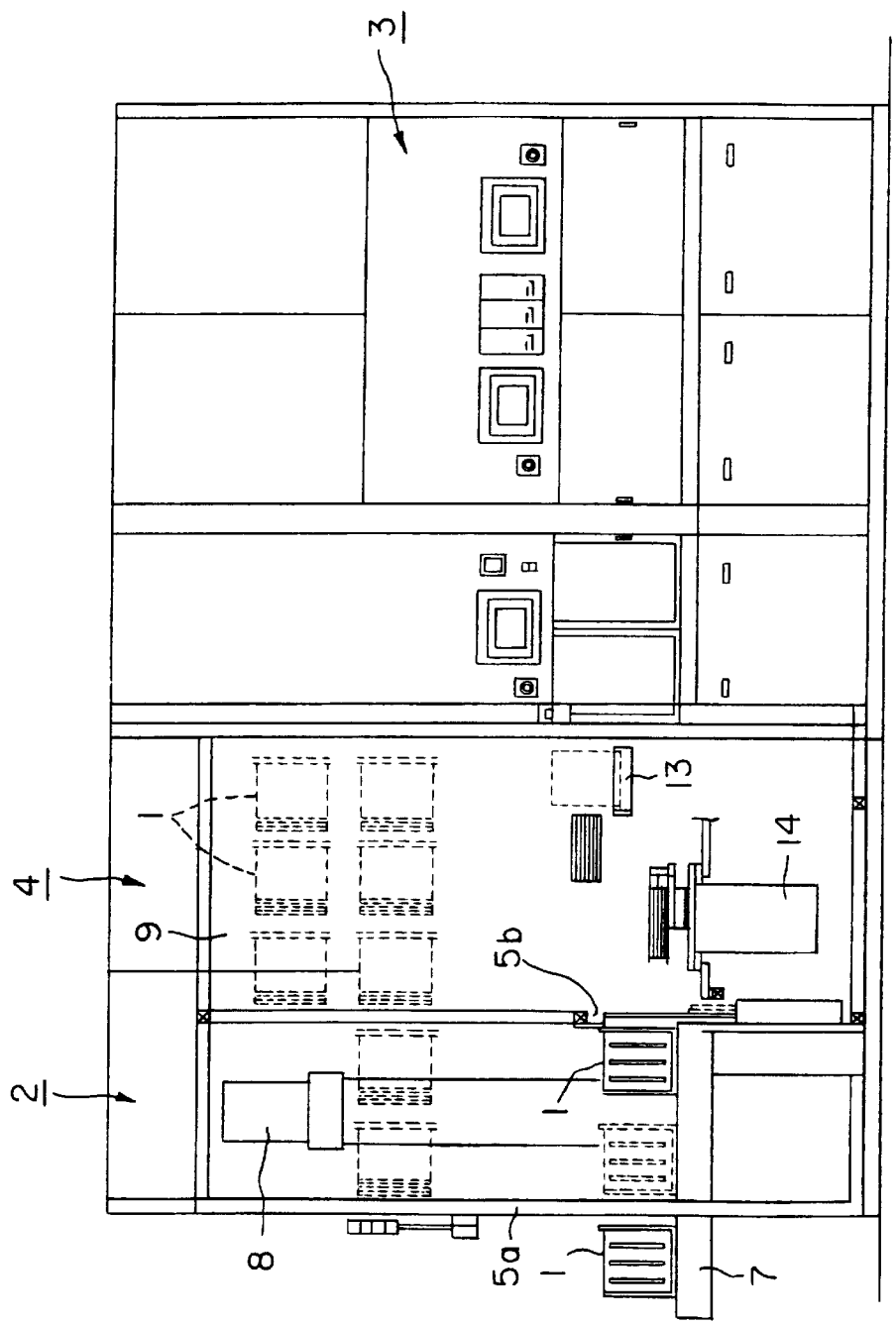
FIG. 2 is a schematic side view of the cleaning and drying system of FIG. 1.

The description first concerns the overall configuration of a cleaning and drying system to which the cleaning and drying apparatus of the present invention is applied, with reference to FIGS. 1 and 2. FIG. 1 is a schematic plan view of an example of such a cleaning and drying system and FIG. 2 is a schematic side view thereof.

This cleaning and drying system is provided with a conveyor portion 2 for conveying carriers 1 into and out of the system, where each carrier 1 contains substrates to be processed which are semiconductor wafers W in a horizontal state; a processing portion 3 for processing the wafers W with chemicals or cleaning fluids and also drying them; and an interface portion 4 located between the conveyor portion 2 and the processing portion 3, for receiving the wafers W, adjusting the positions thereof, and changing the attitudes thereof.

The conveyor portion 2 is provided with an inlet portion 5 and an outlet portion 6 aligned along one side edge portion of the cleaning and drying system. A sliding mounting table 7 is provided in each of an inlet port 5a of the inlet portion 5 and an outlet port 6a of the outlet portion 6, to enable the carriers 1 to be moved freely into the inlet portion 5 and out of the outlet portion 6

Each of the inlet portion 5 and the outlet portion 6 is further provided with a carrier lifter 8. Each carrier lifter 8 is capable of transferring a carrier 1 to and from the corresponding inlet portion or outlet portion, and is also capable of transferring a carrier 1 containing wafers W into a carrier standby portion 9 provided in an upper portion of the conveyor portion 2, or transferring an empty carrier 1 that is in the carrier standby portion 9 (see FIG. 2).

The interface portion 4 is divided by a partitioning wall 4c into a first chamber 4a in close proximity to the inlet portion 5 and a second chamber 4b in close proximity to the outlet portion 6. A wafer removal arm 10 that is capable of horizontal movement (in the X and Y directions), vertical movement (in the Z direction), and rotation (about the θ axis), for removing a plurality of wafers W from a carrier 1 in the inlet portion 5; a notch aligner 11 for detecting notches provided in the wafers W and causing them to be aligned; a spacing adjustment mechanism 12 for adjusting the spacing of a plurality of the wafers W that have been taken by the wafer removal arm 10; and a first attitude modification device 13 for changing the horizontal state of the wafers W to a vertical state are disposed within the first chamber 4a.

A wafer transfer arm 14 for picking up a plurality of processed wafers W from the processing portion 3 while still in a vertical state and conveying them; a second attitude modification device 13A for changing the vertical state of the wafers W received from the wafer transfer arm 14 to a horizontal state; and a wafer accommodation arm 15 that is capable of horizontal movement (in the X and Y directions), vertical movement (in the Z direction), and rotation (about the θ axis), for taking the plurality of wafers which have been converted to a horizontal state by the second attitude modification device 13A and accommodating those wafers W in an empty carrier 1 that has been conveyed into the outlet portion 6 are disposed within the second chamber 4b.

Note that the second chamber 4b is sealed from the exterior and the atmosphere therein can be replaced by an inert gas such as nitrogen ($N_2$) supplied from a nitrogen source (not shown in the figures).

A first processing unit 16 that removes particles and organic contaminants adhering to the wafers W; a second processing unit 17 that removes metallic contaminants adhering to the wafers W; a cleaning and drying apparatus 18 (or 18') that removes oxides from the wafers W and is also provided with a drying device for drying the wafers W; and a chuck cleaning unit 19 are disposed in a line within the processing portion 3. A wafer conveyor chuck 21 that is capable of horizontal movement (in the X and Y directions), vertical movement (in the Z direction), and rotation (about the θ axis) is disposed in a position corresponding to all of these units 16 to 19.

First Preferred Embodiment of Cleaning and drying Apparatus

Figure 3:
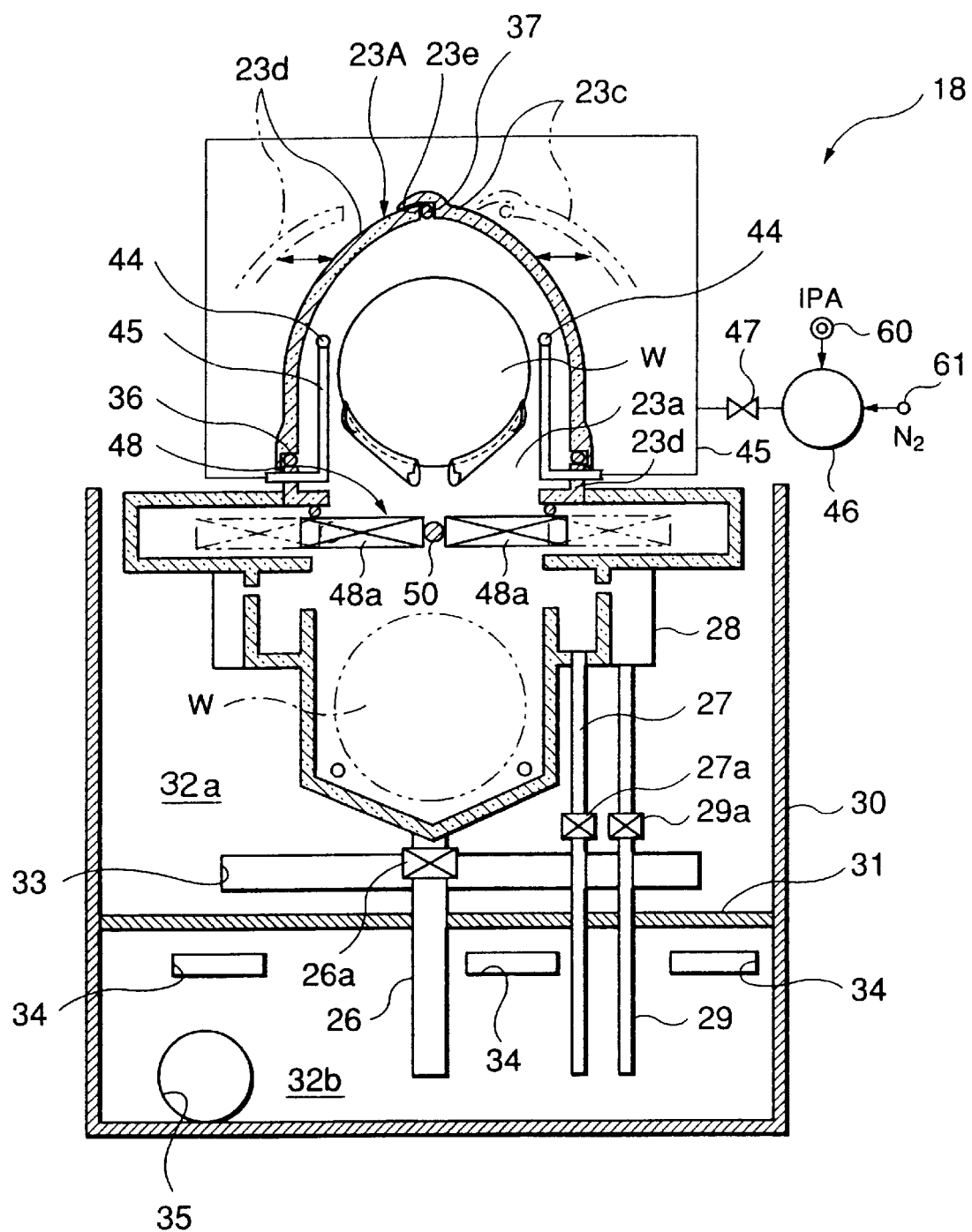
FIG. 3 is a cross-sectional view of a first embodiment of the cleaning and drying apparatus of the present invention.
Figure 13:
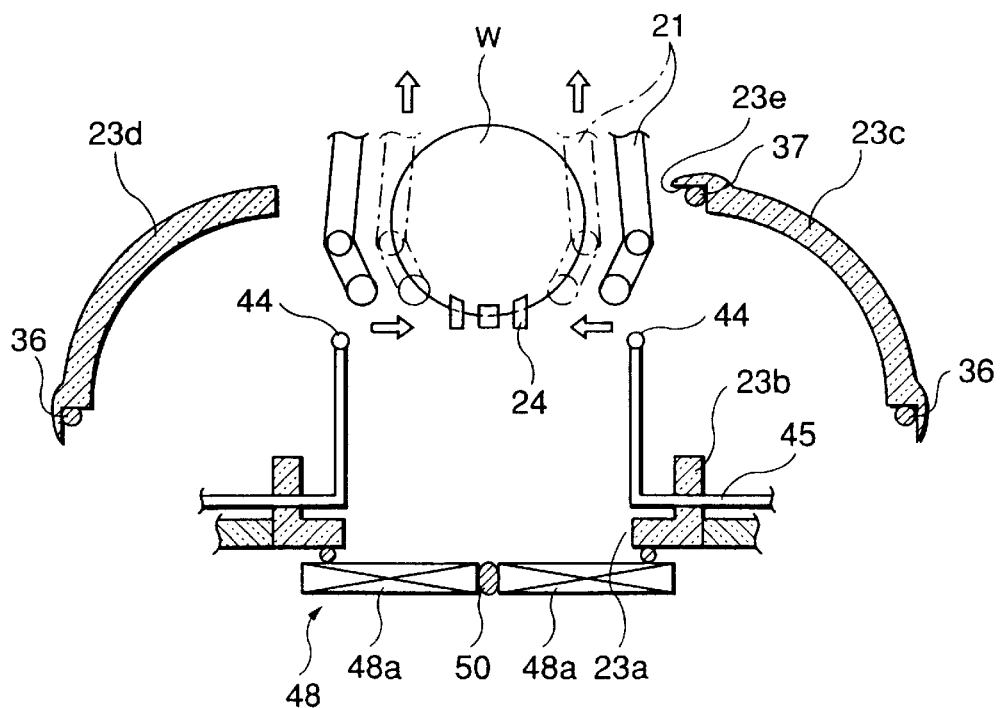
FIG. 13 is a schematic cross-sectional view of a step of removing the wafers after the drying.

The description now turns to a first embodiment of the cleaning and drying apparatus of the present invention, with reference to FIGS. 3 and 13.

The cleaning and drying apparatus 18 has a cleaning tank 22 (cleaning chamber) which is filled with a chemical such as hydrofluoric acid and a rinse (cleaning liquid) such as distilled water, where the wafers W are immersed in this chemical and cleaning liquid; and a drying chamber 23 positioned above the cleaning tank 22. The cleaning and drying apparatus 18 also has a wafer boat 24, in other words a first holder device, for holding a plurality of wafers W, such as 50 wafers W, and moving them between the cleaning tank 22 and the drying chamber 23.

The cleaning tank 22 has an inner tank 22a formed of a material such as quartz or polypropylene and an outer tank 22b disposed on the outer side of an upper portion of the inner tank 22a, for stopping any overflowing cleaning liquid from the inner tank 22a.

Chemical/cleaning liquid supply nozzles (hereinafter called liquid supply nozzles) 25 are disposed on both sides of a lower portion of the inner tank 22a, for ejecting the chemical or the cleaning liquid towards the wafers W positioned within the cleaning tank 22. The liquid supply nozzles 25 are connected to a chemical supply source and a distilled water supply source (both not shown in the figures), with switching valves therebetween. The chemical or the distilled water are selectively supplied from the liquid supply nozzles 25 to the interior of the cleaning tank 22 for accumulation therein, by switching these valves.

An exhaust port is provided in a base portion of the inner tank 22a and a drain pipe 26 is connected to this exhaust port with an exhaust valve 26a provided therein. An exhaust port that is similarly provided in a base portion of the outer tank 22b is connected to a drain pipe 27 with an exhaust valve 27a provided therein. Note that an exhaust box 28 is disposed on the outer side of the outer tank 22b, and an exhaust pipe 29 is connected to an exhaust port provided in this exhaust box 28 with a valve 29a provided therein.

The cleaning tank 22 and exhaust box 28 of the above described configuration are disposed within a cylindrical, bottomed box 30. The box 30 is partitioned horizontally by a dividing plate 31 into an upper chamber 32a on the cleaning-tank side and a lower chamber 32b. Effluent outlets of the drain pipes 26 and 27 and the exhaust pipe 29, which are connected to the inner tank 22a and the outer tank 22b, are positioned in this lower chamber 32b. This configuration prevents the atmosphere and droplets of exhaust liquids within the lower chamber 32b from entering the upper chamber 32a, to maintain the cleanliness of the upper chamber 32a. Note that an exhaust window 33 is provided in a side wall of the upper chamber 32a, exhaust windows 34 are provided in an upper side wall of the lower chamber 32b, and an effluent window 35 is provided in a lower side wall thereof.

The drying chamber 23 is defined by an enclosure 23A made of quartz. This enclosure 23A is configured of a base element 23b acting as a fixed base that has a communicating port 23a into the cleaning tank 22, and first and second enclosing elements 23c and 23d that act as enclosure halves having a substantially fan-shaped section, as shown in FIGS. 3 and 5. The enclosure halves 23c and 23d and the base element 23b are connected together hermetically by sealing members 36 such as packing or 0-rings. The enclosure halves 23c and 23d can be utilized in an engaged state and in a separated state.

A stepped portion 23e is provided in an engagement surface of an edge portion of one enclosure half 23c of these enclosure halves 23c and 23d, so as to cover the outer side of an edge portion of the other enclosure half 23d. A sealing member 37, such as packing or an 0-ring, is attached to the engagement surfaces of the enclosure halves 23c and 23d to obstruct the gap therebetween.

The drying chamber 23 of a semicircular cylindrical shape and having an airtight seal is formed by the mutual hermetic engagement between the enclosure halves 23c and 23d and the base element 23b.

As best shown in FIG. 5, a guide rail 38 is disposed along one side of the enclosure 23A, extending in a direction perpendicular to the direction in which the enclosure 23A opens, in other words, perpendicular to the engagement surfaces of the enclosure halves 23c and 23d. Two sliders 39 engage in a freely slidable manner with the guide rail 38. The sliders 39 are linked by connective members 40 to a cylinder body 41a and a piston rod 41b, respectively, of a horizontal air cylinder 41 that acts as a horizontal-direction drive device.

A vertical air cylinder 42 is disposed vertically on an upper portion of each of the sliders 39 to act as a vertical-direction drive device 42. Free end portions of piston rods 42a protruding from the vertical air cylinder devices 42 are connected to the enclosure halves 23c and 23d, respectively, by substantially L-shaped brackets 43.

An auxiliary guide rail 38a that is parallel to the guide rail 38 is disposed along the other side of the enclosure 23A. The auxiliary guide rail 38a also has two sliders 39 engaging therewith in a freely slidable manner. A vertical air cylinder 42 is disposed vertically on an upper portion of each of the sliders 39. Free end portions of piston rods 42a protruding from these vertical movement devices 42 are connected to the enclosure halves 23c and 23d, respectively, by substantially L-shaped brackets 43.

The above described configuration ensures that the enclosure halves 23c and 23d move up or down by the action of the vertical air cylinders 42 to move away from or towards the base element 23b. The enclosure halves 23c and 23d can also move sideways by the action of the horizontal air cylinder 41.

Figure 4:
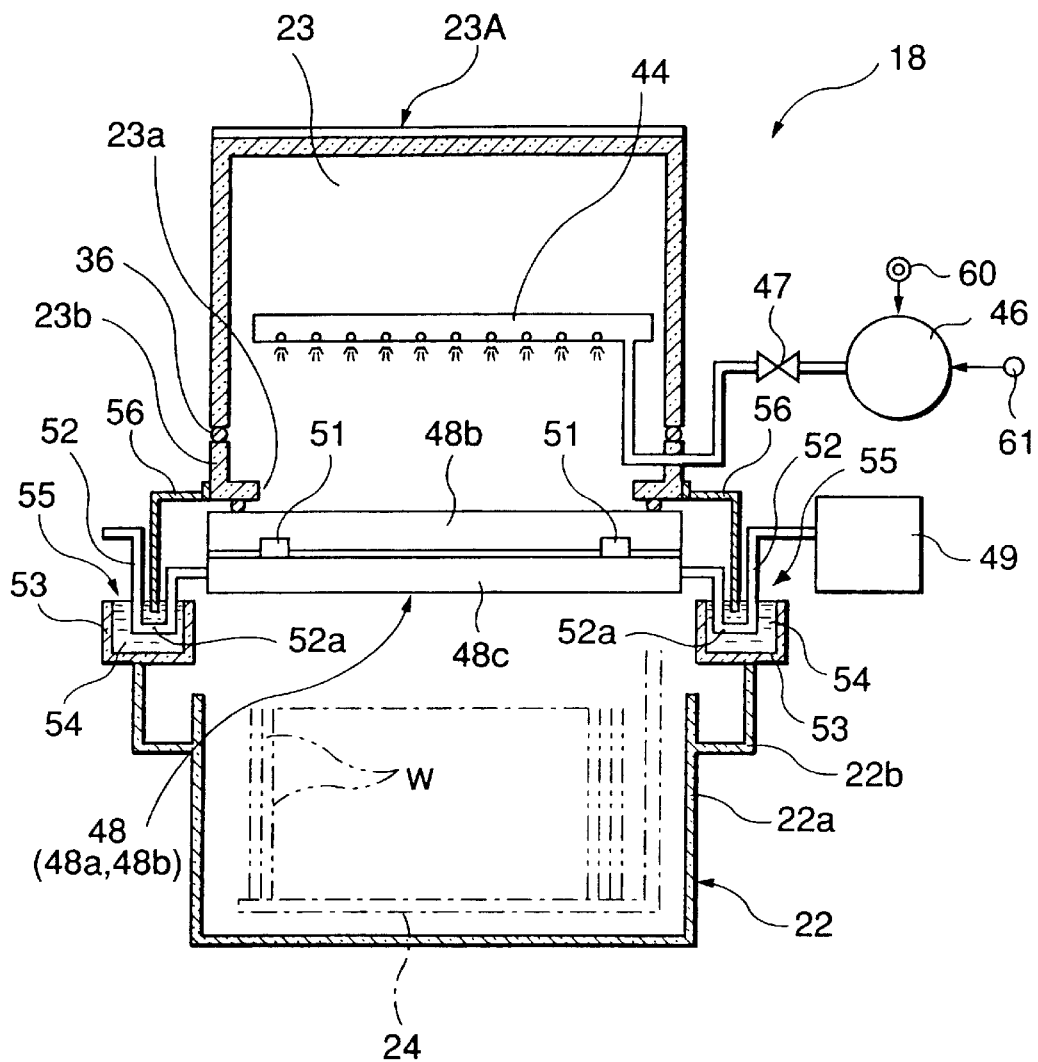
FIG. 4 is a schematic lateral cross-sectional view of the cleaning and drying apparatus of FIG. 3.

As best shown in FIGS. 3 and 4, drying gas supply nozzles 44 are disposed on both sides of an upper portion of the interior of the drying chamber 23. These nozzles 44 are formed as shower nozzles provided with a plurality of nozzle apertures at a suitable spacing in a nozzle body, as shown in FIG. 4. The nozzles 44 are connected to a drying gas generator 46 by a supply pipeline 45 that passes through the base element 23b.

The drying gas generator 46 is connected to a source 60 of a liquid for producing a drying gas, such as isopropyl alcohol (IPA), and a source 61 of a carrier gas, such as nitrogen ($N_2$). A switching valve 47 is provided in the supply pipeline 45 so that a drying gas (IPA+$N_2$) generated by the drying gas generator 46 can be supplied into the drying chamber 23 from the nozzles 44 by opening the switching valve 47.

Note that nitrogen alone can be supplied from the drying gas supply nozzles 44 into the drying chamber 23, by halting the supply of IPA. In that case, the configuration could be such that the opening and closing actions of the switching valve 47 are achieved on the basis of signals from a control means such as a central processing unit (CPU) that is not shown in the figures.

An organic solvent such as alcohols such as IPA, or ketones, or ethers, or polyatomic alcohols could be used for the drying gas used in this apparatus. Note that, in such a case, the drying gas could be either an organic solvent such as IPA alone or a mixture of IPA and nitrogen.

A shutter 48 is disposed in the communicating portion between the cleaning tank 22 and the drying chamber 23, to block this communicating portion. This shutter 48 is formed of two shutter halves 48a that can move in sideways directions so as to engage and separate, as shown in FIGS. 3 and 4, in a manner similar to that of the enclosure 23A that defines the drying chamber 23.

The two shutter halves 48a are linked together by a cylinder body and a piston rod (not shown in the figure) of a horizontal air cylinder 49 that forms a shutter opening/closing device, in a manner similar to that of the horizontal air cylinders 41. The shutter halves 48a are moved to mutually engage or separate by the action of the horizontal air cylinder 49, to close or open the communicating portion. A sealing member 50 such as packing is attached to a connective portion of one of the two shutter halves 48a, in such a manner that airtightness is maintained when the shutter halves 48a are in a connected state, that is, when the shutter 48 is closed.

Each of the shutter halves 48a is divided into an upper shutter member 48b and a lower shutter member 48c. The spacing between these shutter members 48b and 48c in the connection/separation direction (that is, vertically) can be adjusted by a plurality of cylinders 51, such as eight cylinders 51, interposed therebetween. This separation of each of the shutter halves 48a into an upper shutter member 48b and a lower shutter member 48c with an adjustable gap therebetween ensures that, when the shutter 48 has been closed, the shutter 48 can be engaged in a hermetic manner against the base element 23b of the enclosure 23A. Thus the cleaning tank 22 and the drying chamber 23 can be reliably isolated.

Wing pieces 52 that are bent into a crank-shaped section are provided protruding from both sides of each lower shutter member 48c of the shutter halves 48a. The wing pieces 52 extend along the direction of movement of the shutter halves 48a when they open or close. One of the wing pieces 52 is connected to the horizontal air cylinder 49 for opening and closing the shutter 48. Bent portions 52a of the two wing pieces 52 are immersed in a sealing liquid 54 such as water that fills a trough-shaped tank 53 provided on an upper portion of the cleaning tank 22. A liquid seal 55 is formed by the bent portions 52a of the wing pieces 52, the trough-shaped tank 53 containing the bent portions 52a in a movable manner, and the sealing liquid 54 filling the trough-shaped tank 53. The atmosphere inside of the cleaning tank 22 and the atmosphere outside thereof are isolated by the liquid seal 55.

Note that, although this is not shown in the figures, the sealing liquid 54 is constantly supplied from a supply port provided in a lower portion of the trough-shaped tank 53 and is also constantly exhausted from an effluent outlet provided in a side portion of an upper portion of the trough-shaped tank 53, so that clean sealing liquid 54 is continuously replenishing the trough-shaped tank 53.

The cleaning tank 22 and the horizontal air cylinder 49 are separated by a partitioning wall 56. A lower portion of this partitioning wall 56 is immersed in the sealing liquid 54, within the bent portions 52a of lo the wing pieces 52 positioned in the trough-shaped tank 53. This makes it possible to ensure that the processing portions within the cleaning tank 22 and the atmosphere on the horizontal air cylinder 49 side are reliably isolated.

Note that, the configuration is such that the horizontal air cylinder 49 and the cylinders 51 are driven on the basis of signals from the control portion (the CPU), so that the shutter halves 48a can be opened and closed.

Note that, the atmospheres of the drying area and the drive side can be reliably isolated by forming the connective members 40 to have bent portions in a similar manner to the wing pieces 52 and by forming a seal by immersing these bent portions in the sealing liquid within the trough-shaped tank.

The operation of this cleaning and drying apparatus 18 will now be described with reference to FIGS. 6 to 13.

Figure 6:
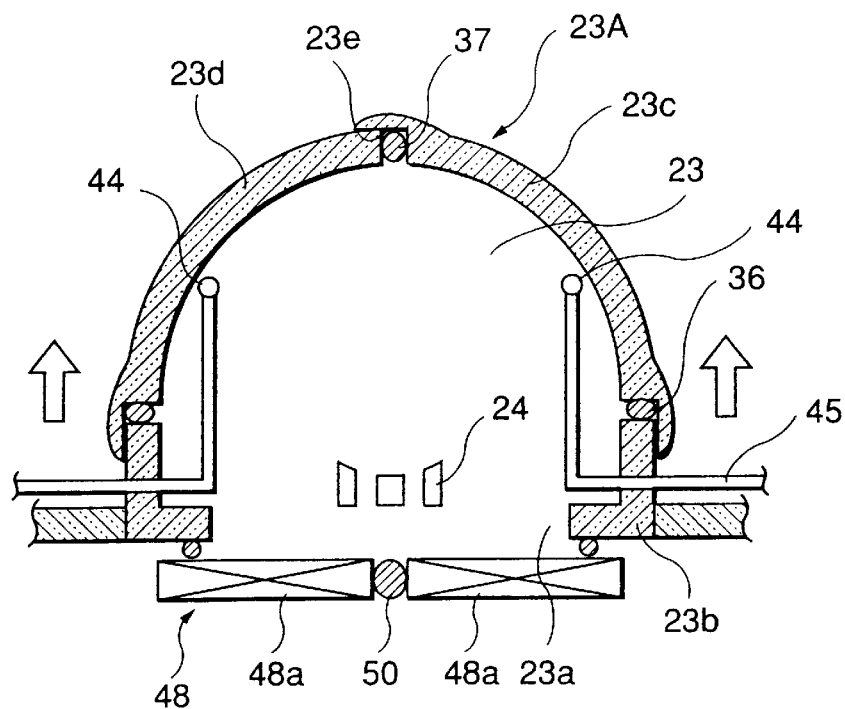
FIG. 6 is a schematic cross-sectional view of an initial state of the enclosing elements of FIG. 3.

To convey a plurality of wafers W into the cleaning and drying apparatus, the vertical air cylinders 42 are first driven to raise the enclosure halves 23c and 23d and thus release their sealed state with respect to the base element 23b, as shown in FIG. 6.

Figure 7:
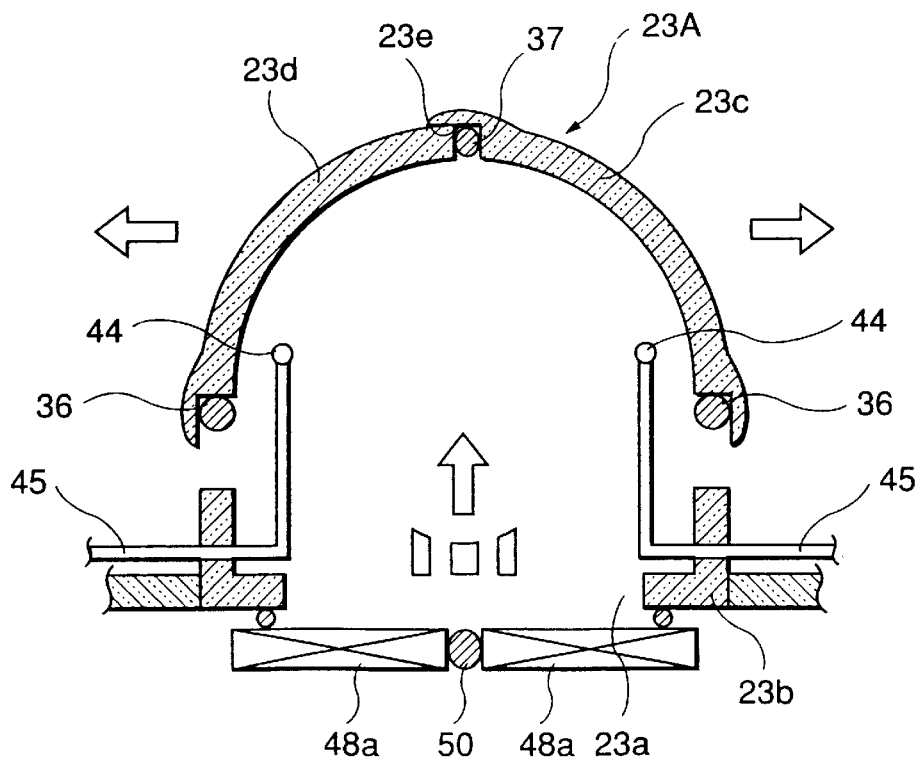
FIG. 7 is a schematic cross-sectional view of the raising of the enclosing elements of FIG. 3.

The horizontal air cylinders 41 are then driven to move the enclosure halves 23c and 23d in directions that separate them (see FIG. 7). During this time, the wafer boat 24 is raised and moved up to a wafer reception position.

Figure 8:
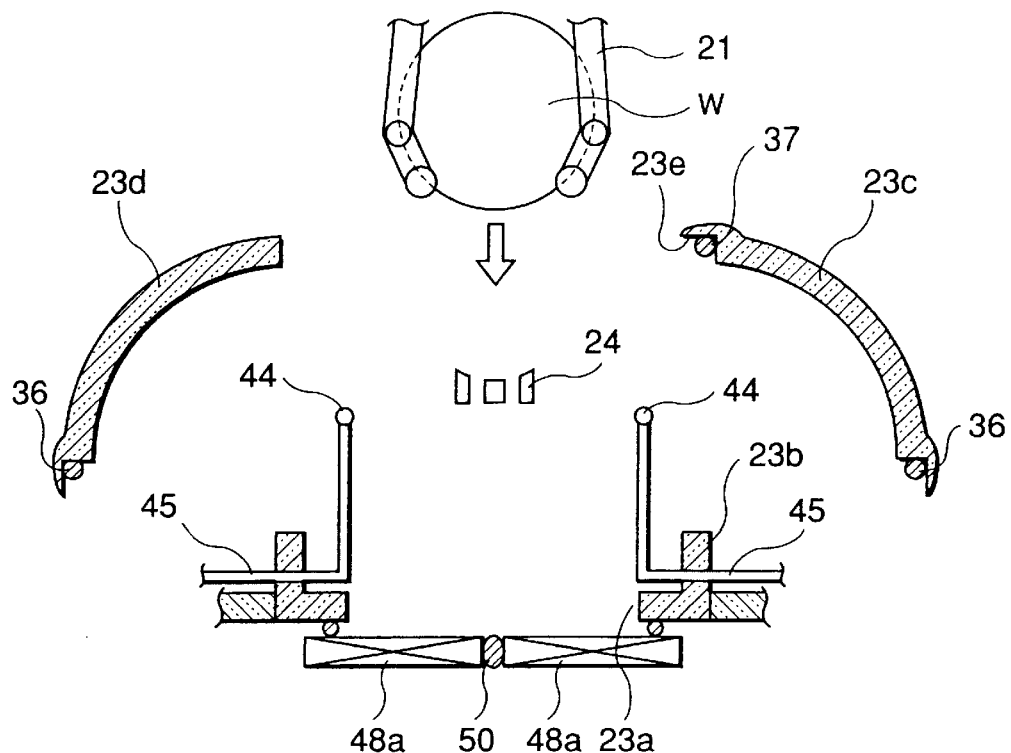
FIG. 8 is a schematic cross-sectional view of the relative separation of the enclosing elements of FIG. 3.
Figure 9:
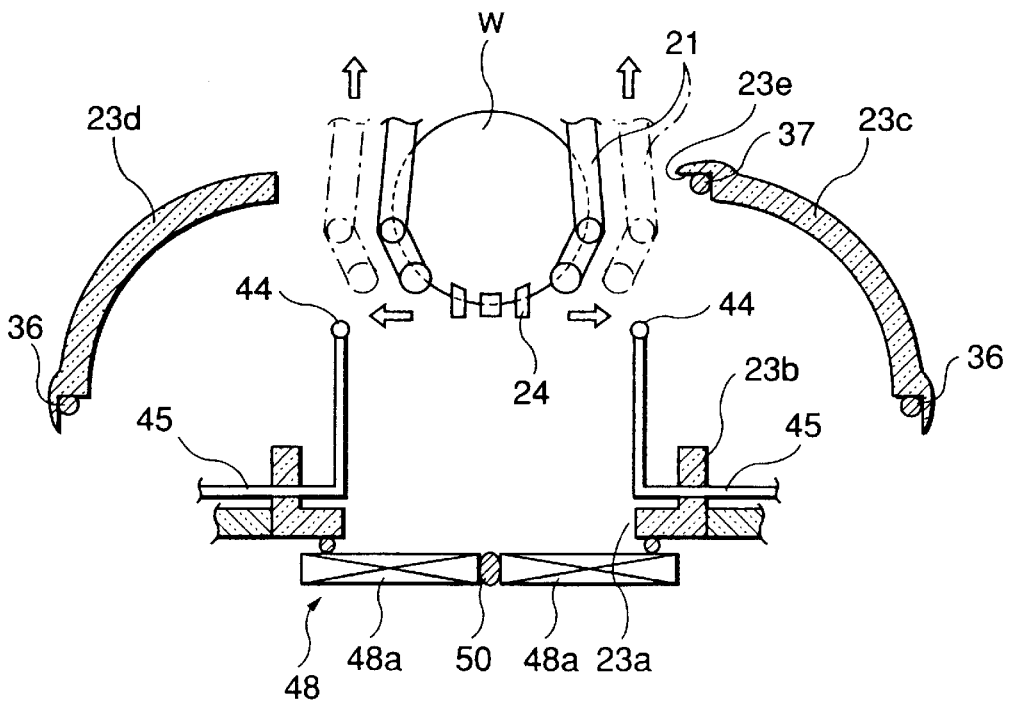
FIG. 9 is a schematic cross-sectional view of the operation of transferring wafers.

In this state, the wafer conveyor chuck 21 holding a plurality of wafers W is lowered through the gap between the released enclosure halves 23c and 23d, as shown in FIG. 8, to place the wafers W on the wafer boat 24. The wafer conveyor chuck 21 subsequently opens outward to transfer the wafers W to the wafer boat 24 (see FIG. 9).

Figure 10:
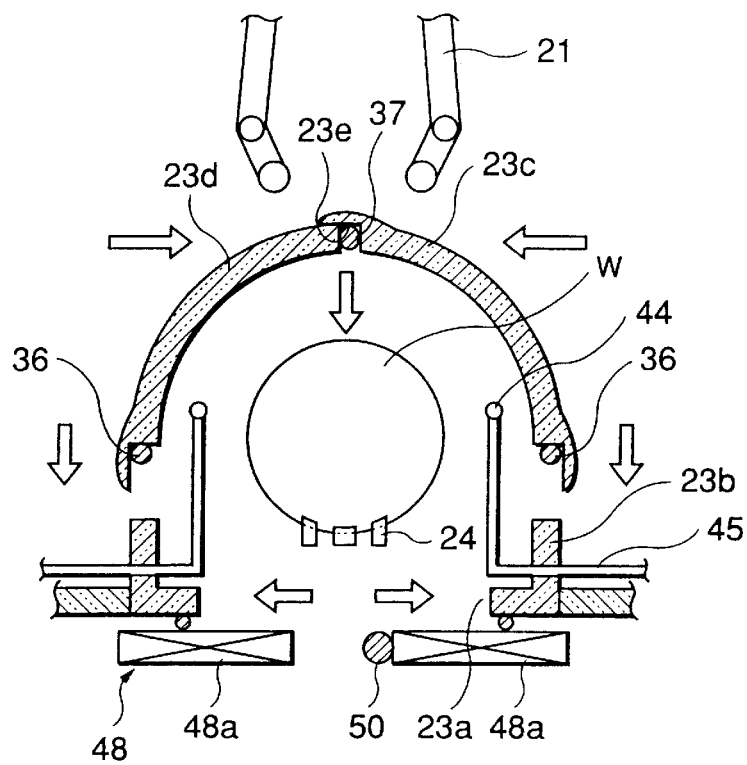
FIG. 10 is a schematic cross-sectional view of the operation of engaging the enclosing elements after the wafers have been transferred.

After the wafers W have been transferred to the wafer boat 24, the wafer conveyor chuck 21 retreats to above the drying chamber 23, as shown in FIG. 10. At the same time that the wafer conveyor chuck 21 retreats, the horizontal air cylinders 41 are driven in the opposite direction to that described above, to engage the enclosure halves 23c and 23d. The vertical air cylinders 42 are then driven in the opposite direction to that described above, to lower the enclosure halves 23c and 23d into close contact with the base element 23b. The wafer boat 24 also lowers to move the wafers W into the cleaning tank 22.

Figure 11:
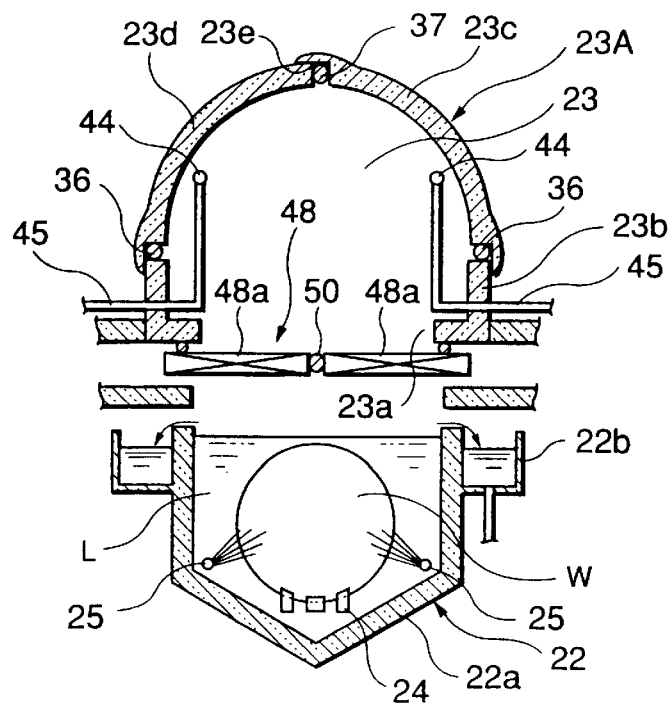
FIG. 11 is a schematic cross-sectional view of a wafer cleaning step.

The horizontal air cylinder 49 for opening and closing the shutter is then driven to close the shutter 48. In this state, the chemical or cleaning liquid, such as distilled water L, is poured in until it overflows, to perform the cleaning, as shown in FIG. 11. If chemical processing and cleaning are to be performed in sequence, the procedure could be such that the cleaning liquid is supplied from the nozzles after the chemical for the chemical processing has been drained, or the chemical is replaced by the cleaning liquid after the chemical processing.

After the cleaning has been completed, the wafer boat 24 is raised to move the wafers W into the drying chamber 23, and the shutter halves 48a close. This occurs before, during, or after the distilled water L within the cleaning tank 22 is discharged from the lower portion of the cleaning tank 22.

Figure 12:
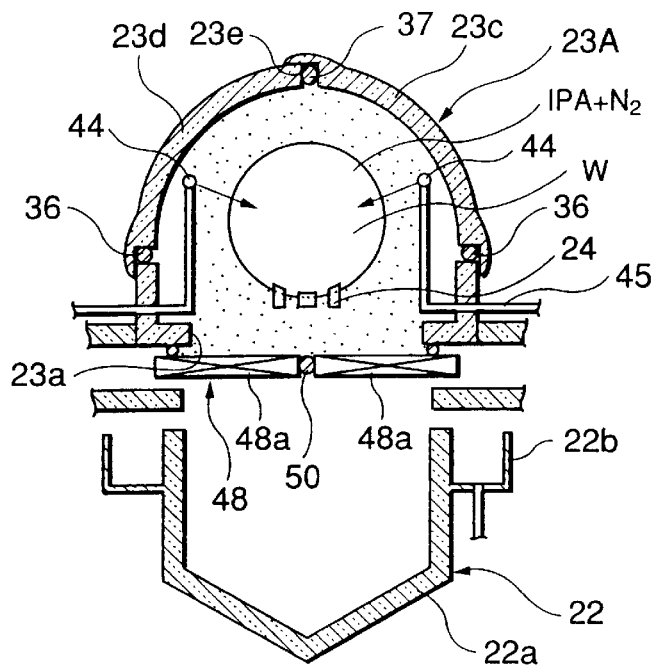
FIG. 12 is a schematic cross-sectional view of a wafer drying step.

Then the drying gas (IPA+$N_2$) is supplied from the drying gas supply nozzles 44 into the drying chamber 23 in this state, as shown in FIG. 12. The drying gas comes into contact with the surfaces of the wafers W, and thus drying is performed. After the drying, $N_2$ is supplied instead of the drying gas, completing the drying process.

After the drying has been completed, the enclosure halves 23c and 23d are raised and are also moved in directions to mutually separate them, as shown in FIG. 13, opening the upper portion of the drying chamber 23. The wafer conveyor chuck 21 then intrudes towards the wafers W held in the wafer boat 24, to extract and remove the wafers W. After that, the wafer conveyor chuck 21 retreats from within the drying chamber 23 and moves the wafers W on to the next process.

As described above, this embodiment of the invention makes it possible to horizontally divide the enclosure 23A that defines the drying chamber 23. This make it possible to facilitate the removal and insertion of wafers W within the drying chamber 23, without increasing the dimensions of the drying chamber 23. Since this makes it possible to reduce the internal volume of the drying chamber 23, an improvement in drying efficiency and a decrease in the consumption of drying gas can be achieved. The apparatus itself can also be made more compact.

In the abovementioned embodiment, the conveyor chuck 21 inserts the wafers into the drying chamber 23 downwardly from an upper space between the enclosure halves 23c and 23d, alternatively the conveyor chuck 21 may insert the wafers into the drying chamber 23 sidewardly from a side space between the enclosure halves 23c and 23d.

Figure 14A:
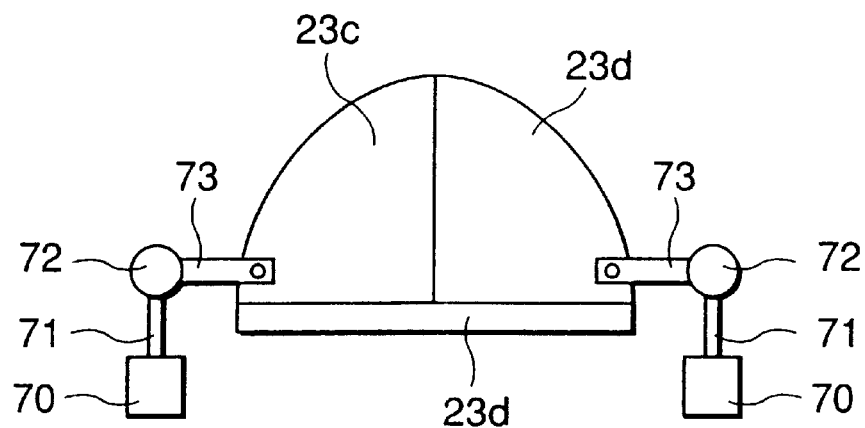
FIGS. 14A and 14B are schematic views of another drive mechanism for the enclosing elements.
Figure 14B:
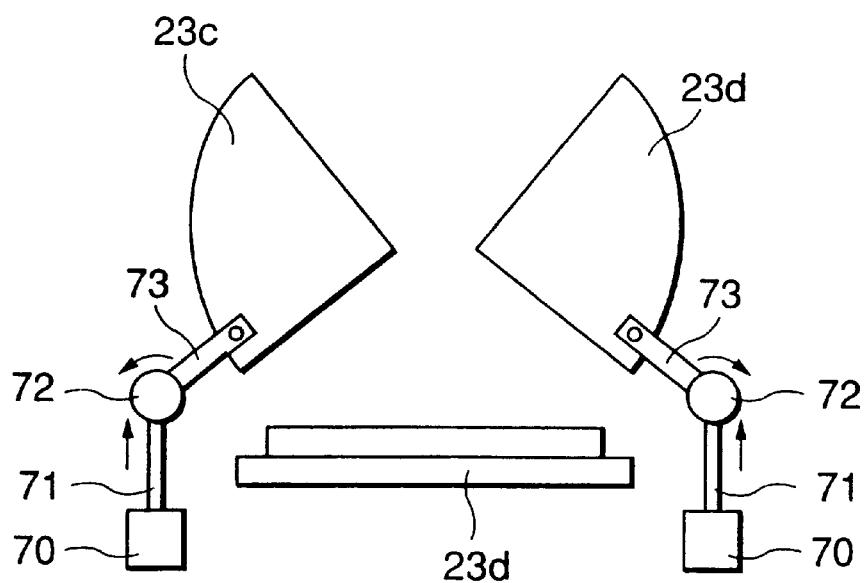

Note that horizontal air cylinders 41 were used in the above embodiment as means for causing the enclosure halves 23c and 23d to mutually separate in the horizontal direction, but the present invention is not to be taken as limited thereto. In other words, as shown in FIG. 14, the configuration could be such that each of the enclosure halves 23c and 23d is provided with a vertical cylinder 70, and a motor 72 is attached to a free end portion of a piston rod 71 of each vertical cylinder 70. A bracket 73 is attached to the rotational shaft of each motor 72, and the enclosure halves 23c and 23d are attached to the corresponding brackets 73.

To open the drying chamber 23 in this case, the vertical cylinders 70 are driven to cause the enclosure halves 23c and 23d to rise and separate from the base element 23b. The motors 72 are then operated to rotate the enclosure halves 23c and 23d about the centers of the rotational axes of the motors 72. This configuration makes it possible to move the enclosure halves 23c and 23d so as to mutually separate horizontally.

Second Preferred Embodiment of Cleaning and drying Apparatus

The description now turns to a second embodiment of the cleaning and drying apparatus of the present invention, with reference to FIGS. 15 to 25.

Figure 15:
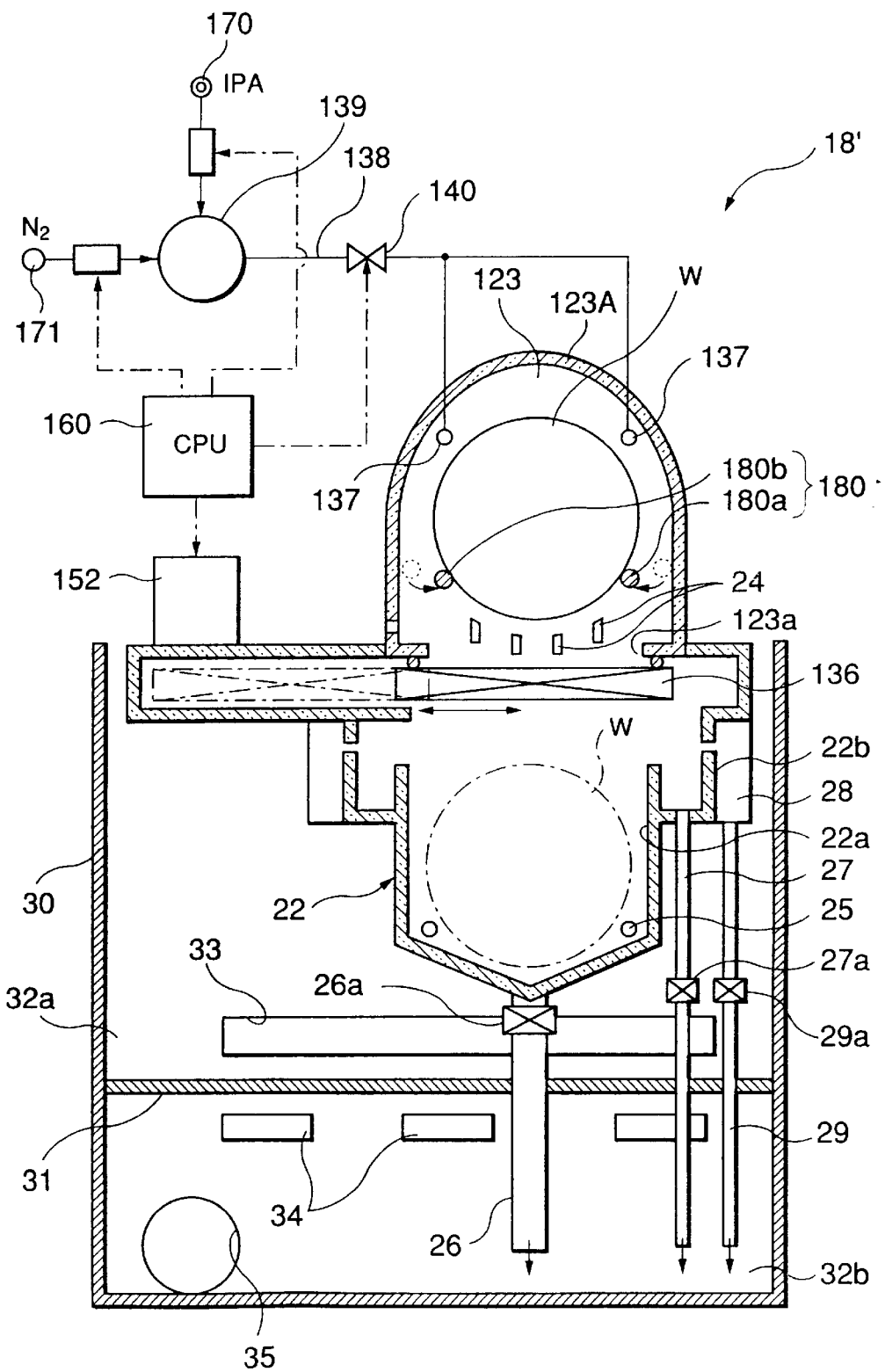
FIG. 15 is a cross-sectional view through a second embodiment of the cleaning and drying apparatus of the present invention.
Figure 16:
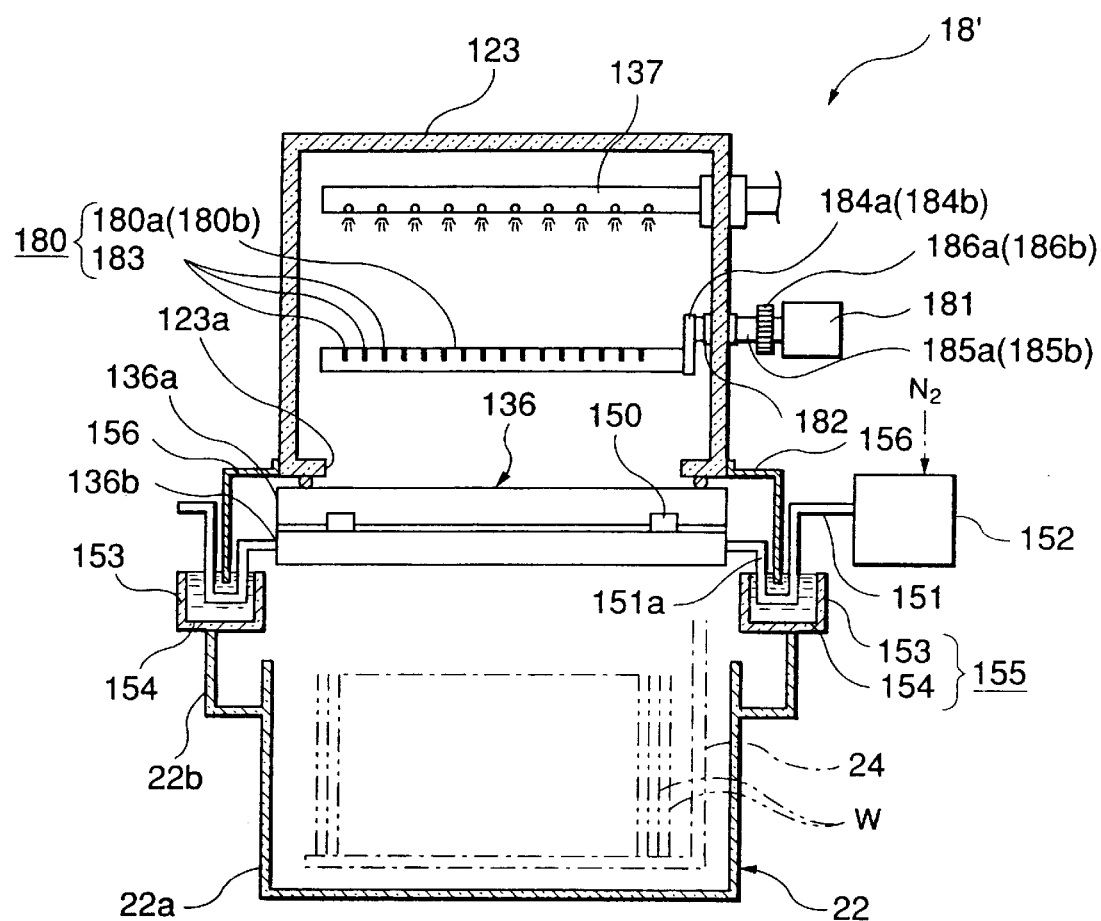
FIG. 16 is a lateral cross-sectional view of the cleaning and drying apparatus of FIG. 15.

FIG. 15 is a cross-sectional view of the cleaning and drying apparatus of this second embodiment and FIG. 16 is a side sectional view thereof. As shown in these figures, the elements configuring a cleaning and drying apparatus 18' of this embodiment are the same as those of the cleaning and drying apparatus 18 of the first embodiment, concerning the cleaning chamber 22 and the box 30. Identical elements are given the same reference numbers.

The description below concerns the configuration of a drying chamber 123. The drying chamber 123 is defined by an enclosure 123A which is made of quartz and is U-shaped in section. An aperture 123a that communicates with an aperture in an upper portion of the cleaning tank 22, with a shutter 136 therebetween, is formed in the enclosure 123A, drying gas supply nozzles 137 are disposed on both sides of an upper portion of the interior of the drying chamber 123. These nozzles 137 are connected to a drying gas generator 139 by a supply pipeline 138. The drying gas generator 139 is connected to a source 170 of a liquid for producing a drying gas, such as isopropyl alcohol (IPA), and a source 171 of a carrier gas, such as nitrogen ($N_2$).

The ratio of the IPA from the IPA source 170 to the $N_2$ form the $N_2$ source 171 is set on the basis of control signals from a control device, such as a CPU 160. A switching valve 140 is provided in the supply pipeline 138 so that a drying gas (IPA+$N_2$) generated by the drying gas generator 139 can be supplied into the drying chamber 123 from the nozzles 137 by opening the switching valve 140. An organic solvent such as an alcohol ketone such as IPA, or an ether, or a polyatomic alcohol could be used for the drying gas used in this apparatus.

A wafer holder 180 for holding wafers W while they are being dried is provided in the drying chamber 123. The holder 180 comprises two mutually parallel quartz holder rods 180a and 180b that act as holding elements. As shown in FIG. 17, each of the holder rods 180a, 180b is formed to have a plurality of grooves 183, such as 50 grooves, at a suitable spacing in the axial direction thereof. The holder rods 180a, 180b hold the wafers W therebetween by the grooves 183 thereof.

The holder rods 180a and 180b are respectively attached by crank arms 184a and 184b to end portions of rotational shafts 185a and 185b within the drying chamber that pass through a side wall of the drying chamber 123. The rotational shafts 185a and 185b are respectively attached to mutually engaging gears 186a and 186b, and one rotational shaft 185a is linked to a motor 181 that is capable of rotating in a positive direction. The rotational shafts 185a and 185b are connected to the side wall of the enclosure 123A via shaft bearings 182 having a sealing capability, so that the airtight seal of the drying chamber 123 is maintained thereby.

This configuration ensures that, if the motor 181 is activated to rotate the rotational shaft 185a through a predetermined angle, the rotation of the rotational shaft 185a is transmitted to the holder rod 180a through the crank arm 184a, to cause the holder rod 180a to move through an arc in a certain direction, such as clockwise. At the same time, the rotation of the rotational shaft 185a is transmitted through the gears 186a and 186b to cause the rotational shaft 185b to rotate in the opposite direction, and this rotation is transmitted through the crank arm 184b to cause the holder rod 180b to move through an arc in another direction, such as counterclockwise. Therefore, the holder rods 180a and 180b can selectively adopt either a standby position in which the rods 180a, 180b are spaced apart sidewardly from the wafers W transferred into the drying chamber 123 or a holding position in which the rods 180a, 180b hold the lower side portions of the wafers W (see FIG. 17), depending on the direction of rotation of the motor 181, so that they either release the wafers W or hold them.

As shown in FIG. 16, the shutter 136 is divided into an upper shutter member 136a and a lower shutter member 136b, where the spacing between these shutter members 136a and 136b in the connection/separation direction (that is, vertically) can be adjusted by a plurality of cylinders 150, such as eight cylinders 150, interposed therebetween. This configuration ensures that, when the shutter 136 has been closed, the shutter 136 can be placed in hermetic contact against the enclosure 123A, so that the cleaning tank 22 and the drying chamber 123 can be reliably isolated.

Wing pieces 151 that are bent into a crank-shaped section are provided protruding from both sides along the direction of opening/closing of the lower shutter member 136b, and one of these wing pieces 151 is connected to an opening/closing drive device 152 for the shutter 136. An inert gas such as nitrogen is supplied to the interior of the casing, and bent portions 151a of the two wing pieces 151 are disposed in movable manner in a state in which they are immersed in a sealing liquid 154 such as water that fills a trough-shaped tank 153 provided on an upper portion of the cleaning tank 22. Thus a liquid seal is formed by this embodiment, in a similar manner to that of the first embodiment.

The cleaning tank 22 and the drive device 152 are separated by a partitioning wall 156. A lower portion of this partitioning wall 56 is immersed in the sealing liquid 154, within the bent portions 151a of the wing pieces 151 positioned in the trough-shaped tank 153, so that the processing portions within the cleaning tank 22 and the atmosphere on the drive device 152 side are isolated. Note that, in this case, the drive device 152 and the cylinders 150 are driven on the basis of signals from the CPU 160, to open and close the shutter 136.

The operation of this cleaning and drying apparatus will now be described with reference to FIGS. 18 to 21.

Cleaning

Figure 18:
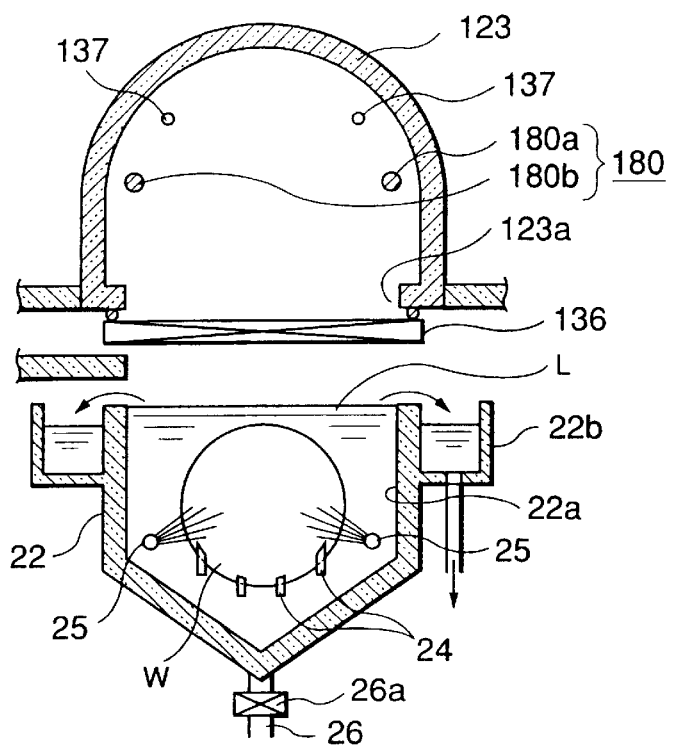
FIG. 18 is a schematic cross-sectional view illustrating the cleaning step in the first cleaning and drying method used in the cleaning and drying apparatus of FIG. 15.

After wafers W have been accommodated within the cleaning tank 22 with the shutter 136 open, the shutter 136 is closed as shown in FIG. 18 and distilled water L is poured in until it overflows, to perform the cleaning.

Drying

Figure 19:
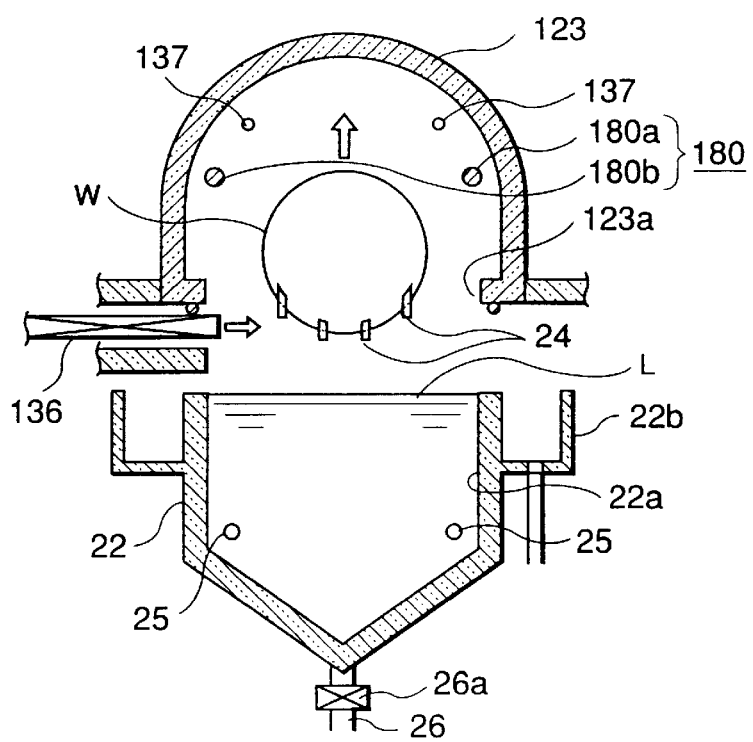
FIG. 19 is a schematic cross-sectional view illustrating the step of moving wafers in the first cleaning and drying method.

After the cleaning, the shutter 136 is opened and the wafer boat 24, is raised to move the wafers W into the drying chamber 123, as shown in FIG. 19. During this time, the distilled water L still pours into the cleaning tank 22 and is exhausted therefrom.

Figure 20:
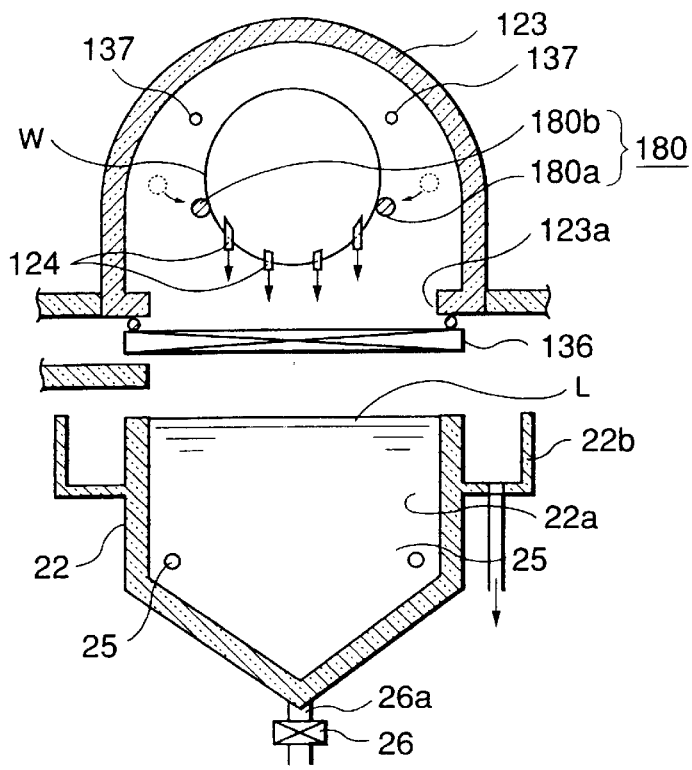
FIG. 20 is a schematic cross-sectional view illustrating the step of transferring wafers from the first holder device to the second holder device in the first cleaning and drying method.

The shutter 136 is then closed and the motor 181 is driven so that a portion of the wafers W that differs from the portion thereof in contact with the wafer boat 24 is held by the holder rods 180a and 180b of the holder 180, as shown in FIG. 20. During this time, the wafers W are held by the holder 180 and the wafer boat 24 is moved downward simultaneously, so that the holding of the wafers W thereby is released.

Figure 21:
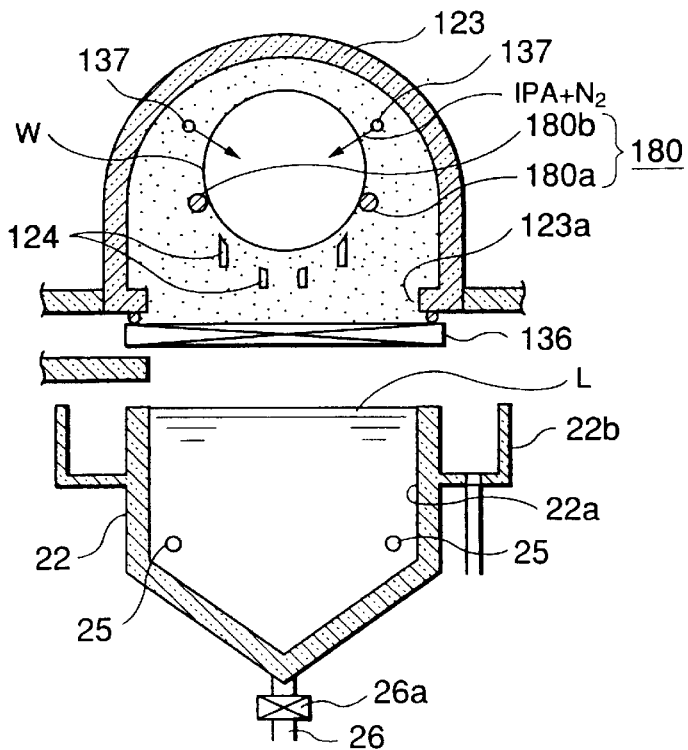
FIG. 21 is a schematic cross-sectional view illustrating a drying step in the first cleaning and drying method.

The drying gas (IPA+N$_2$) is then supplied to the interior of the drying chamber 123 from the drying gas supply nozzles 137, as shown in FIG. 21, so that any moisture remaining on the wafers W due to the distilled water L and condensed cleaning gas is removed therefrom, drying the surfaces of the wafers W. Nitrogen alone is then supplied to complete the drying step.

Note that after the wafer boat 24 is raised and the wafers W have been moved into the drying chamber 123, but before the wafers W are transferred to the holder 180, a preliminary drying could be performed with the wafers W still held by the wafer boat 24.

In this drying step, the wafers W are transferred from the wafer boat 24 to the holder 80 within the drying chamber 123 in such a manner that contact portions therebetween are different, thus solving the problem of bad drainage at the contact portions and also making it easier for the drying gas to come into contact with those portions. Therefore, the drying time can be reduced and also the consumption of drying gas can be decreased, thus making it possible to expect an improvement in drying efficiency. It is also possible to reduce unevenness in the drying, enabling an increase in yield. The start time for the next wash can also be reduced by exchanging the cleaning liquid in the cleaning tank 22 during the drying step.

The description now concerns an altanative operation of this cleaning and drying apparatus, with reference to FIGS. 22 to 26.

Cleaning

The procedure for this cleaning step is the same as that described above (see FIG. 22).

First Drying Step

Figure 22:
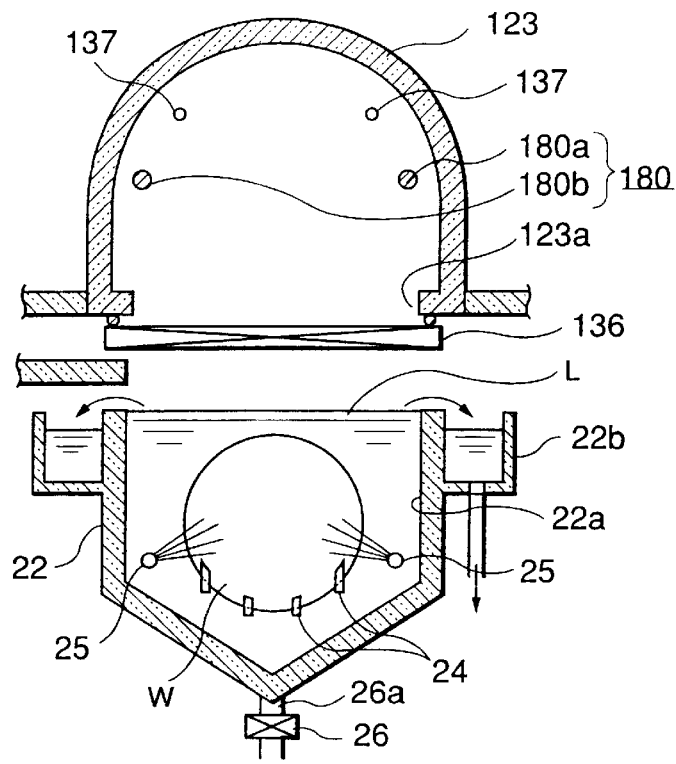
FIG. 22 is a schematic cross-sectional view illustrating the cleaning step in the second cleaning and drying method used in the cleaning and drying apparatus of FIG. 15.
Figure 23:
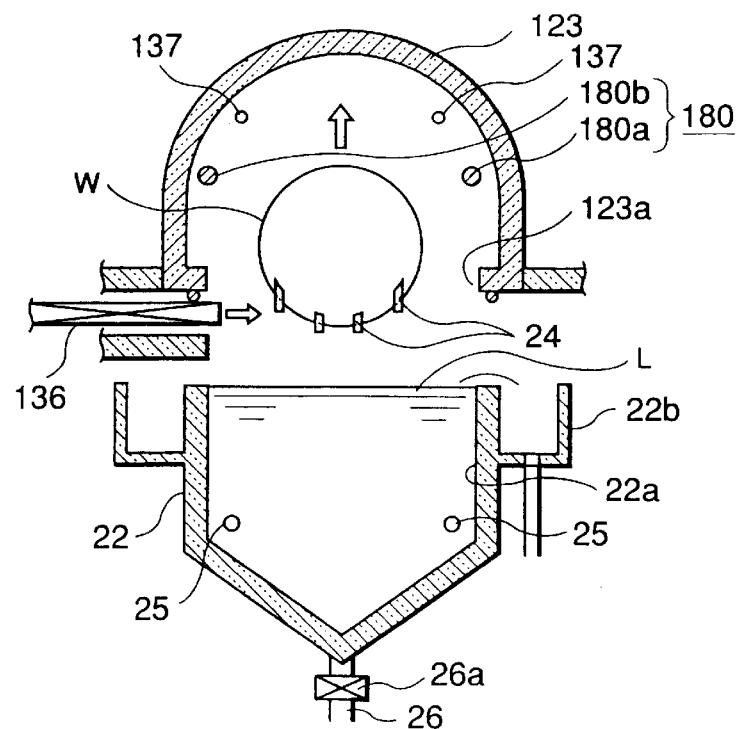
FIG. 23 is a schematic cross-sectional view illustrating the step of moving wafers in second first cleaning and drying method.
Figure 24:
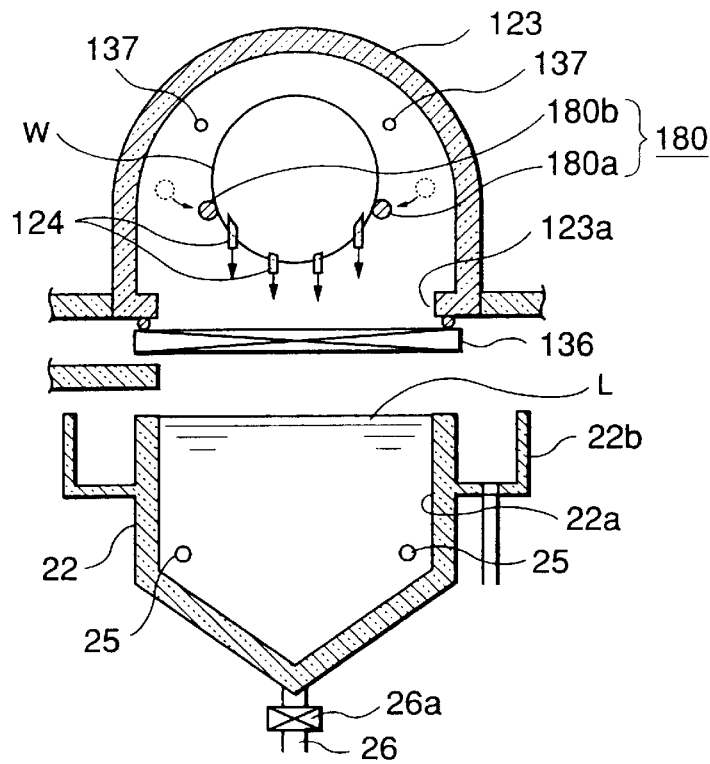
FIG. 24 is a schematic cross-sectional view illustrating the step of transferring wafers from the first holder device to the second holder device in the second cleaning and drying method.
Figure 25:
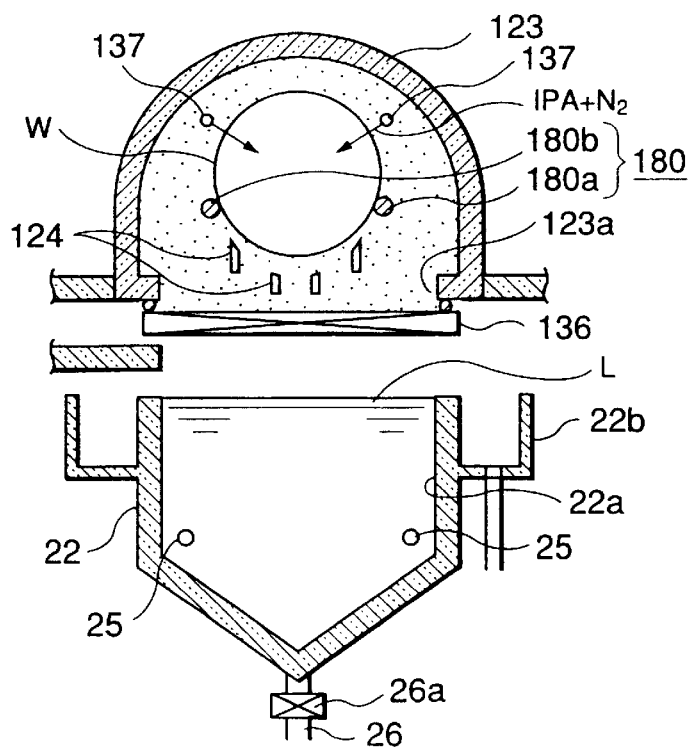
FIG. 25 is a schematic cross-sectional view illustrating a first drying step in the second cleaning and drying method.
Figure 26:
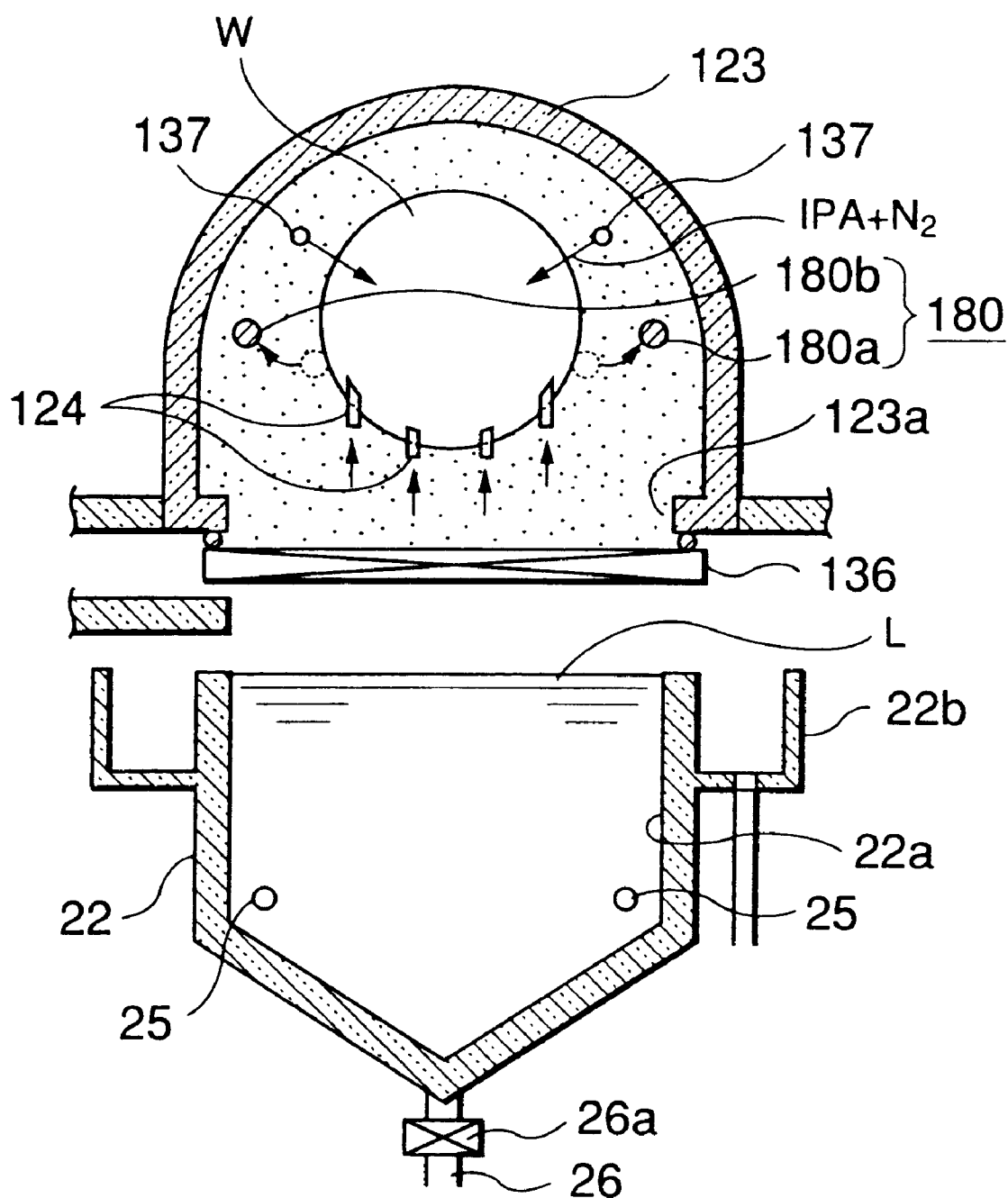
FIG. 26 is a schematic cross-sectional view illustrating the step of transferring wafers from the first holder device to the second holder device in the second cleaning and drying method, and the second drying step therein.
Figure 27:
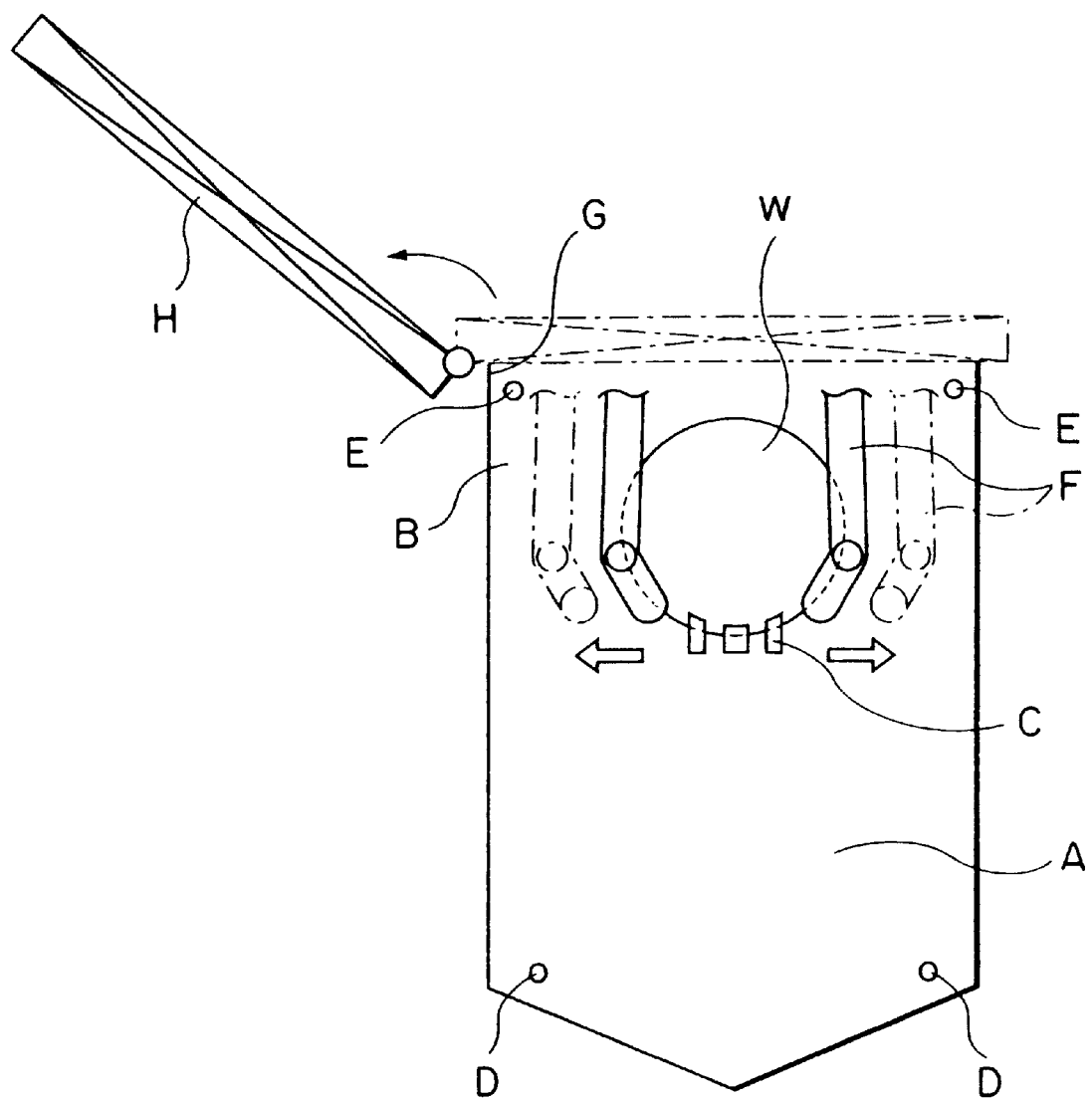
FIG. 27 is a schematic cross-sectional view of a conventional cleaning and drying apparatus.

After the cleaning shown in FIG. 22, the shutter is opened and the wafer boat 24 is raised to move the wafers W into the drying chamber 123, as shown in FIG. 23. The shutter 136 is then closed and the motor 181 is driven so that the wafers W are held by holder rods 180a and 180b of the holder 180 at portions that differ from the portions thereof in contact with the wafer boat 24, as shown in FIG. 24. Simultaneous with the holding of the wafers W by the holder 180, the wafer boat 24 is moved downward to release the holding of the wafers W, the drying gas is supplied to the interior of the drying chamber 123 from the drying gas supply nozzles 137, as shown in FIG. 25, and thus any moisture remaining on the wafers W due to the distilled water L and condensed cleaning gas is removed therefrom, drying the surfaces of the wafers W.

Note that after the wafer boat 24 is raised and the wafers W have been moved into the drying chamber 123, but before the wafers W are transferred to the holder 180, a preliminary drying could be performed with the wafers W still held by the wafer boat 24.

Second Drying Step

Once the surfaces of the wafers W have been dried by the first drying step, the wafer boat 24 is raised from a standby position separated from the wafers W, to come back into contact with the wafers W and hold them. Simultaneously therewith, the holding of the wafers W by the holder 180 is released, and the supply of drying gas into the drying chamber 123 from the drying gas supply nozzles 137 is continued without change (see FIG. 26).

The drying process could be completed by supplying N$_2$ alone instead of the drying gas after the second drying step.

In this second drying step, the wafers that had been transferred from the wafer boat 24 to the holder 180 during the first dying step are transferred back from the holder 180 to the wafer boat 24, so that if there should be any moisture at portions held by the holder 180, the problems of bad drainage and the bad contact efficiency of the drying gases at those portions can be solved. It is therefore possible to shorten the drying time even further, reduce the consumption of drying gas, improve the drying efficiency even further, and also further solve the problem of unevenness of drying, thus increasing the yield even further.

Note that the start time for the next wash can also be reduced by exchanging the cleaning liquid in the cleaning tank 22 during the drying step. Note also that the timing at which the drying gas is supplied could be before the wafers W are moved into the drying chamber 123. The first and second embodiments were described above as relating to the application of the cleaning and drying apparatus of the present invention to a cleaning and drying system for semiconductor wafers, but it should be obvious that this invention can also be applied to processing systems other than cleaning and drying systems, and it can be applied to objects to be processed other than semiconductor wafers, such as glass LCD substrates.

What is claimed is:

1. A cleaning and drying apparatus having a cleaning chamber for cleaning an object and a drying chamber positioned above said cleaning chamber for drying said object, said apparatus comprising:

carrying means for carrying said object between said cleaning chamber and said drying chamber, said carrying means being in contact with a first portion of said-object when said carrying means carries said object;

holding means provided in said drying chamber for holding said object in a second portion thereof, said second portion being different from said first portion;

an enclosure defining said drying chamber and having an opening at a bottom portion thereof, said opening allowing said carrying means to carry said object from said cleaning chamber into said drying chamber; and a shutter adapted to close said opening and to sealingly engage with said bottom portion of said enclosure so that said shutter separates an atmosphere in said drying chamber from an atmosphere in said cleaning chamber;

wherein said drying chamber has a semi-circular cross section.

2. The cleaning and drying apparatus according to claim 1, wherein said holding means includes holding elements movable between a holding position for holding said object and a release position in which said holding elements are spaced apart from said object.

3. The cleaning and drying apparatus according to claim 1, wherein said first portion is a lower portion of said object, and wherein said holding means includes a pair of holding elements movable between a holding position for holding side portion of said object which is higher than said lower portion, from both sides of said object, and a release position in which said holding elements are away from said object.

4. The cleaning and drying apparatus according to claim 1, wherein one of said carrying means and said holding means is away from said object when the other of said carrying means and holding means is in contact with said object.

5. The cleaning and drying apparatus according to claim 1, wherein said carrying means including holding elements capable of adopting a state in which said object is held thereby and a state in which the holding of said object is released in said drying chamber.

6. The cleaning and drying apparatus according to claim 1, further comprising:

drying gas supply means for supplying a drying gas into said drying chamber; and a nozzle provided in said drying chamber, for spraying said drying gas supplied from said drying gas supply means onto said object.

7. A cleaning and drying apparatus having a cleaning chamber for cleaning an object and a drying chamber positioned above said cleaning chamber for drying said object, said apparatus comprising:

carrying means for carrying said object between said cleaning chamber and said drying chamber, said carrying means being in contact with a first portion of said object when said carrying means carries said object;

holding means provided in said drying chamber for holding said object in a second portion thereof, said second portion being different from said first portion; and a shutter, arranged between said cleaning chamber and said drying chamber, adapted to separate an atmosphere in said drying chamber from an atmosphere in said cleaning chamber;

wherein said shutter includes:

an upper shutter member and a lower shutter member; and an actuator disposed between the upper and lower shutter members and adapted to cause a relative vertical movement between the upper and lower shutter members.

8. The apparatus according to claim 7, comprising:

an enclosure defining said drying chamber and having an opening at a bottom portion thereof, said opening communicating said cleaning chamber and said drying chamber and allowing said carrying means to carry said object from said cleaning chamber into said drying chamber, wherein said shutter is configured so that said upper shutter member is pressed against said bottom portion of said enclosure upon said vertical relative movement of said shutter members.

9. The apparatus according to claim 7, further comprising:

an actuator that moves said shutter horizontally;

a wing piece, interconnecting said actuator and said shutter, that transmits a movement of said actuator to said shutter in order to move said shutter horizontally, said wing piece having a bent portion; and a tank adapted to contain a sealing liquid, in which said bent portion of said wing piece is immersed in order to form a liquid seal that separates said atmosphere in said cleaning chamber from said atmosphere in said drying chamber.

10. The apparatus according to claim 7, wherein said drying chamber has a semi-circular cross section.

11. A cleaning and drying apparatus having a cleaning chamber for cleaning an object and a drying chamber positioned above said cleaning chamber for drying said object, said apparatus comprising:

carrying means for carrying said object between said cleaning chamber and said drying chamber, said carrying means being in contact with a first portion of said object when said carrying means carries said object;

holding means provided in said drying chamber for holding said object in a second portion thereof, said second portion being different from said first portion;

a shutter arranged between said cleaning chamber and said drying chamber and adapted to separate an atmosphere in said drying chamber from an atmosphere in said cleaning chamber;

an actuator that moves said shutter horizontally;

a wing piece, interconnecting said actuator and said shutter, that transmits a movement of said actuator to said shutter in order to move said shutter horizontally, said wing piece having a bent portion; and a tank adapted to contain a sealing liquid, in which said bent portion of said wing piece is immersed in order to form a liquid seal that separates said atmosphere in said cleaning chamber from said atmosphere in said drying chamber.

12. The apparatus according to claim 11, wherein said drying chamber has a semi-circular cross section.

* * * * *